US006700150B1

United States Patent
Wu

(10) Patent No.: US 6,700,150 B1
(45) Date of Patent: *Mar. 2, 2004

(54) SELF-ALIGNED VERTICAL TRANSISTOR DRAM STRUCTURE

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/223,445

(22) Filed: Aug. 20, 2002

(51) Int. Cl.[7] ............................................. H01L 27/108

(52) U.S. Cl. ..................... 257/296; 257/301; 257/302; 257/305; 257/303; 257/306; 257/300; 257/304; 257/308; 257/905; 438/243; 438/386; 438/242; 438/238; 438/239; 438/399

(58) Field of Search ................................. 257/301, 302, 257/305, 296, 303, 306, 300, 304, 308, 905; 438/243, 386, 242, 238, 239, 399

(56) References Cited

U.S. PATENT DOCUMENTS 6,552,382 B1 * 4/2003 Wu .............................. 257/305

* cited by examiner

Primary Examiner—Eddie Lee
Assistant Examiner—Junghwa Im
(74) Attorney, Agent, or Firm—Pro-Techtor International Services

(57) ABSTRACT

A self-aligned vertical transistor DRAM structure comprising a self-aligned trench structure and a self-aligned common-drain structure are disclosed by the present invention, in which the self-aligned trench structure comprises a deep-trench capacitor region having a vertical transistor and a second-type shallow-trench-isolation region being defined by a spacer technique and the self-aligned common-drain structure comprises a common-drain region being defined by another spacer technique. The self-aligned vertical transistor DRAM structure is used to implement two contactless DRAM arrays. A first-type contactless DRAM array comprises a plurality of metal bit-lines integrated with planarized common-drain conductive islands and a plurality of highly conductive word-lines. A second-type contactless DRAM array comprises a plurality of metal word-lines integrated with planarized common-gate conductive islands and a plurality of common-drain conductive bit-lines.

14 Claims, 23 Drawing Sheets

US 6,700,150 B1

SELF-ALIGNED VERTICAL TRANSISTOR DRAM STRUCTURE

BACKGROUND OF THE INVENTION

1. Field of the Invention

The present invention relates generally to a trench-type DRAM memory cell and its manufacturing method and, more particularly, to a self-aligned vertical transistor DRAM structure and its manufacturing methods.

2. Description of Related Art

A dynamic random-access-memory (DRAM) cell including an access transistor and a storage capacitor has become the most important storage element in electronic system, especially in computer and communication system. The DRAM density is increased very rapidly in order to decrease the cost per bit and, therefore, an advanced photolithography is needed to decrease the minimum-feature-size (F) of a cell.

The output voltage of a DRAM cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench-type or a stack-type. The trench-type is formed by forming a deep trench in a semiconductor substrate without increasing the surface area of the semiconductor-substrate surface. The stack-type is formed by implementing a capacitor structure over the access transistor and its nearby dummy-transistor structure through the conductive contact-plug over the node diffusion region of the access transistor. Basically, the cell size of the stack-type DRAM is limited by a dummy transistor being formed over the isolation region. Accordingly, the limit cell size of the stack-type DRAM is $8F^2$ for shallow-trench-isolation. However, the cell size of a trench-type lateral transistor DRAM is limited by the space between nearby deep-trench capacitors and the separation between the lateral access transistor and the deep-trench capacitor. Therefore, the limit cell size of a trench-type lateral transistor DRAM is also $8F^2$ if the separation between the lateral access transistor and the trench capacitor can't be minimized.

A typical example of a trench-type lateral transistor DRAM cell is shown in FIG. 1, in which a deep trench is formed in a semiconductor substrate 100. A trench capacitor is formed in a lower portion of the deep trench, in which a lower capacitor node 101 is formed by a heavily-doped n+ diffusion region using an arsenic-silicate-glass (ASG) film as a dopant diffusion source; an upper capacitor node 103a is made of doped polycrystalline-silicon; and a capacitor-dielectric layer 102 is formed by a composite dielectric layer such as an oxide-nitride-oxide structure or a nitride-oxide structure. An oxide collar 104 is used to separate the lower capacitor node 101 from a source diffusion region 105a, 105b, and a capacitor-node connector 103b being made of doped polycrystalline-silicon is used to electrically connect the upper capacitor node 103a to a source conductive node 103c. The source conductive node 103c is made of heavily-doped polycrystalline-silicon to act as a dopant diffusion source for forming an n+ source diffusion region 105a. A shallow-trench-isolation (STI) region 106 is filled with a CVD-oxide layer in order to separate nearby trench capacitors. Two gate-stacks 108, 109 are formed over an upper surface, in which one gate-stack 108 is acted as a passing word line and another gate-stack 109 being acted as an excess transistor. A common-source diffusion region 105b and a common-drain diffusion region 107 for a bit-line node are formed in an upper surface of the semiconductor substrate 100. From FIG. 1, it is clearly seen that the limit cell size is $8F^2$ if the space between two nearby trench capacitors is defined to be a minimum-feature-size (F) of technology used. It is clearly seen that the cell size can be further reduced if the separation between two adjacent deep trenches and the common-source region can be reduced.

Apparently, the common-source diffusion region 105b, 105a and the gate-stack 109 shown in FIG. 1 can be removed and are formed in the deep-trench region to become a vertical transistor DRAM structure, then the semiconductor surface area can be saved at least $2F^2$. However, a depth of the deep trenches becomes deeper, resulting in a further problem for forming a deeper trench. Moreover, the threshold-voltage and the punch-through voltage of the vertical transistor are difficult to be controlled, and a longer channel length is therefore used by the prior art. As a consequence, a deeper trench depth is required, and a slower read/write speed of a memory cell due to a longer channel length becomes another serious problem for the prior art.

It is, therefore, a major objective of the present invention to offer a self-aligned vertical transistor DRAM structure for obtaining a cell size of $4F^2$ or smaller.

It is another objective of the present invention to easily offer different implanted regions for forming punch-through stops and threshold-voltage adjustments of the vertical transistor and the parasitic collar-oxide transistor in a self-aligned manner so a deeper trench is not required.

It is a further objective of the present invention to offer a manufacturing method for forming the self-aligned vertical transistor DRAM structure with less masking photoresist steps.

It is yet another objective of the present invention to offer two different contactless DRAM array structures for high-speed read and write operations.

SUMMARY OF THE INVENTION

A self-aligned vertical transistor DRAM structure and its contactless DRAM arrays are disclosed by the present invention. The self-aligned vertical transistor DRAM structure comprises a self-aligned trench structure and a self-aligned common-drain structure, in which the self-aligned trench structure includes a deep-trench capacitor region having a vertical transistor and a second-type shallow-trench-isolation region being defined by a first sidewall dielectric spacer and the self-aligned common-drain structure includes a common-drain region being defined by a third sidewall dielectric spacer. The deep-trench capacitor region comprises a lower capacitor node made of an n+ diffusion region being formed in a lower portion of a deep trench, a capacitor-dielectric layer being formed over the lower capacitor node, an upper capacitor node made of a planarized heavily-doped polycrystalline-silicon layer being formed over the capacitor-dielectric layer, a collar-oxide layer being formed over the capacitor-dielectric layer and a portion of the upper capacitor node, a source conductive node integrated with a capacitor-node connector being formed on a portion of the upper capacitor node, a common-source diffusion region being formed by out-diffusion of the source conductive node, an isolation-oxide node being formed over the capacitor-node connector, and a conductive-gate node of a vertical transistor being formed on the isolation-oxide node. The second-type shallow-trench-isolation region being formed outside of the first sidewall dielectric spacer comprises a second-type second or third raised field-oxide layer with a bottom surface level approximately equal to that of the collar-oxide layer and an n+ diffusion region being formed under the second-type second or third raised field-oxide layer. A first planarized thick-oxide layer is formed over a portion of the deep-trench capacitor region and over the second-type second or third raised field-oxide layer. The vertical transistor comprises an elongated conductive-gate layer integrated with the conductive-gate node being defined by a second sidewall dielectric spacer, a gate-dielectric layer being formed over a sidewall of the deep trench, a common-drain diffusion region being formed over an upper semiconductor surface, and the common-source diffusion region being formed near the source conductive node for forming a first-type DRAM cell; and comprises the conductive-gate node being defined by a second sidewall dielectric spacer, a planarized common-gate conductive island integrated with a metal word-line being connected with the conductive-gate node, a gate-dielectric layer being formed over a sidewall of the deep trench, a common-drain diffusion region being formed over an upper semiconductor surface, and a common-source diffusion region being formed near the source conductive node for forming a second-type DRAM cell. The common-drain region comprises a common-drain diffusion region having a shallow heavily-doped diffusion region formed within a lightly-doped diffusion region and a planarized common-drain conductive island integrated with a metal bit-line being formed on the common-drain diffusion region outside of a third sidewall dielectric spacer formed over a sidewall of the deep-trench capacitor region for forming the first-type DRAM cell; and comprises a common-drain diffusion region having a shallow heavily-doped diffusion region formed within a lightly-doped diffusion region and a common-drain conductive bit-line being at least formed over the common-drain diffusion region outside of a third sidewall dielectric spacer being formed over a sidewall of the deep-trench capacitor region for forming the second-type DRAM cell. The cell size of the self-aligned vertical transistor DRAM structure can be fabricated to be equal to or smaller than $4F^2$.

The self-aligned vertical transistor DRAM structure of the present invention is used to implement two contactless DRAM arrays. A first-type contactless DRAM array comprises a plurality of first-type DRAM cells, a plurality of metal bit-lines integrated with the planarized common-drain conductive islands being patterned to be aligned above a plurality of active regions, and a plurality of elongated conductive-gate layers integrated with the conductive-gate nodes to act as a plurality of conductive word-lines being formed transversely to the plurality of metal bit-lines. A second-type contactless DRAM array comprises a plurality of second-type DRAM cells, a plurality of metal word-lines integrated with planarized common-gate conductive islands being patterned to be aligned above a plurality of active regions, and a plurality of highly conductive common-drain bus lines acted as a plurality of conductive bit-lines being formed transversely to the plurality of metal word-lines.

DETAILED DESCRIPTION OF THE PREFERRED EMBODIMENTS

Figure 1:
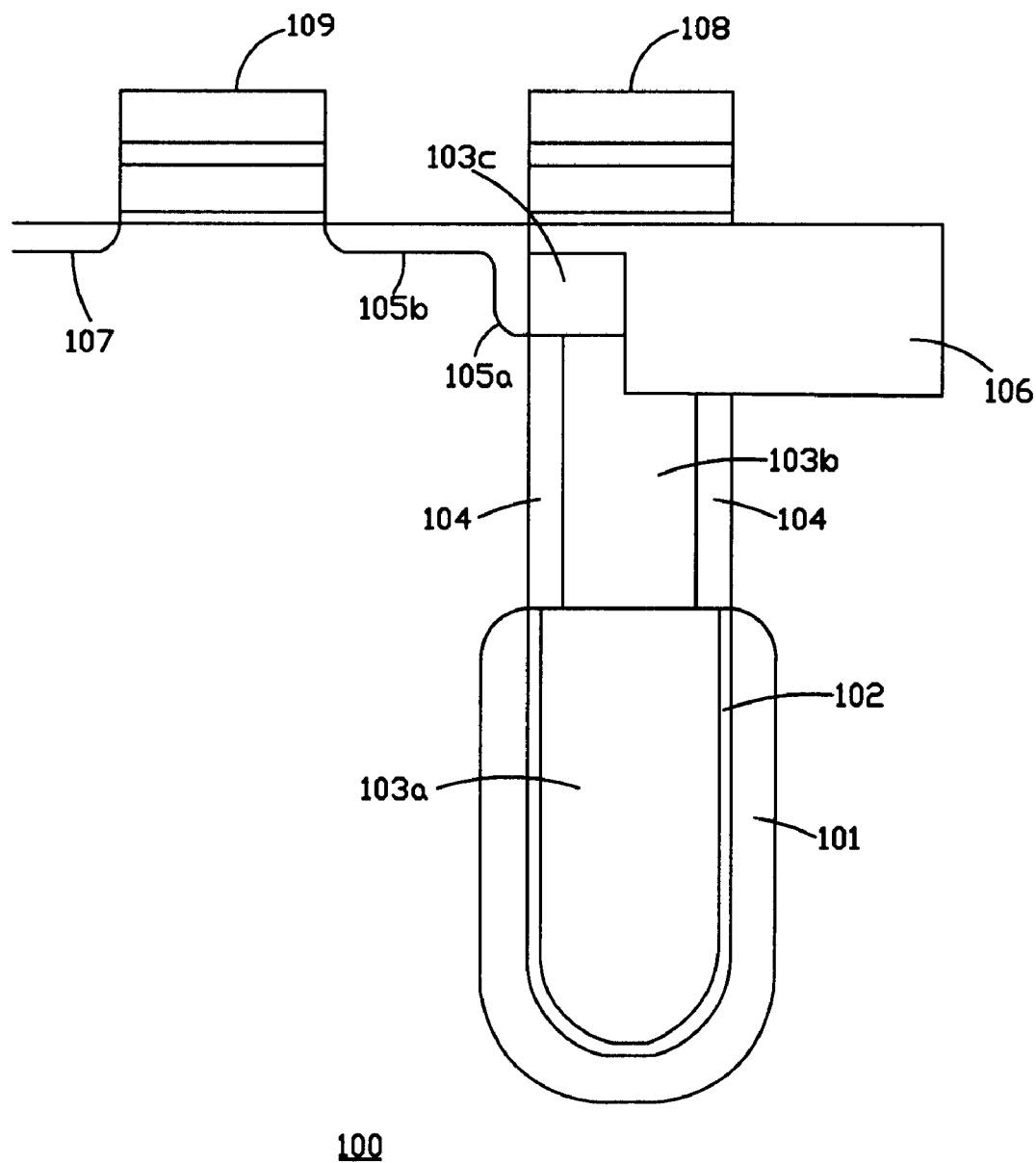
FIG. 1 shows a typical schematic diagram of a trench-type lateral transistor DRAM cell of the prior art.
Figure 2A:
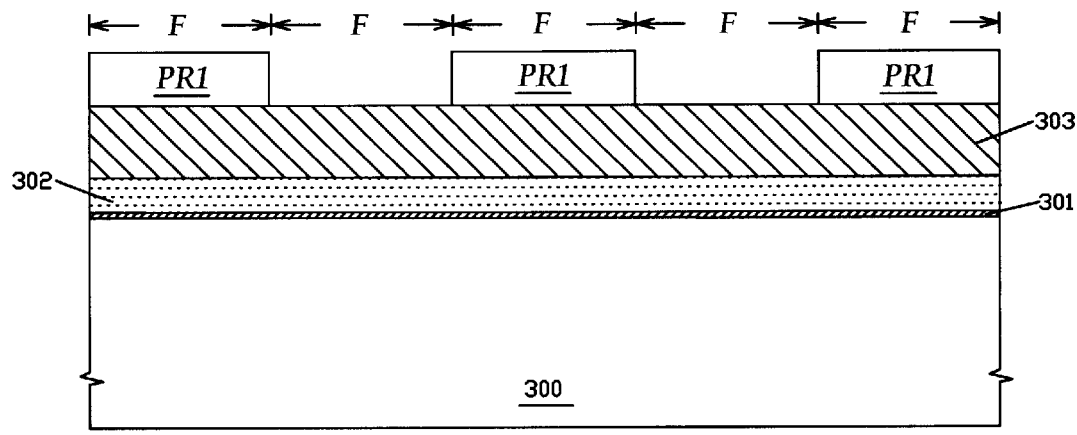
FIG. 2A through FIG. 2C show the process steps and their cross-sectional views of fabricating a first-type shallow-trench-isolation structure for forming a self-aligned vertical transistor DRAM structure of the present invention.
Figure 2B:
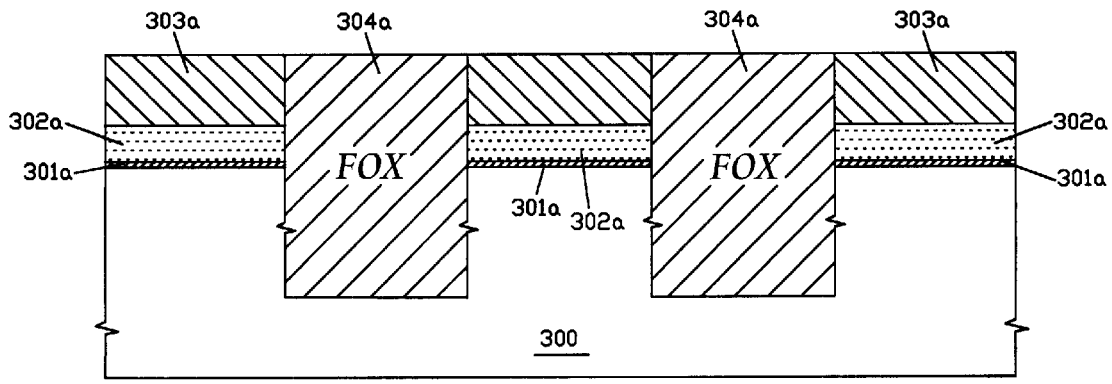
Figure 2C:
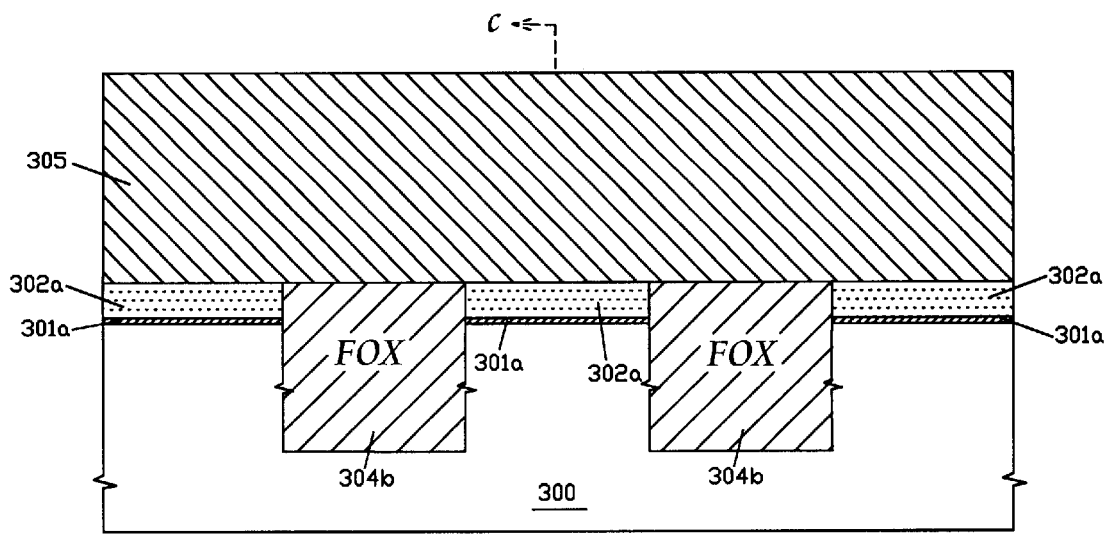

Referring now to FIG. 2A through FIG. 2C, there are shown the process steps and their cross-sectional views of fabricating a first-type shallow-trench-isolation (STI) structure for forming a self-aligned vertical transistor DRAM structure of the present invention. FIG. 2A shows that a first dielectric layer 301 is formed on a semiconductor substrate 300 of a first conductivity type, a first conductive layer 302 is formed on the first dielectric layer 301, a first masking dielectric layer 303 is formed over the first conductive layer 302, and a plurality of masking photoresist PR1 are formed over the first masking dielectric layer 303 to define a plurality of active regions (under PR1) and a plurality of parallel first-type shallow-trench-isolation (STI) regions (outside of PR1). The first dielectric layer 301 is preferably a thermal-oxide layer or a nitrided thermal-oxide layer and its thickness is preferably between 50 Angstroms and 200 Angstroms. The first conductive layer 302 is preferably a doped polycrystalline-silicon or doped amorphous-silicon layer as deposited by low-pressure chemical-vapor-deposition (LPCVD) and its thickness is preferably between 200 Angstroms and 3000 Angstroms. The first masking dielectric layer 303 is preferably made of silicon-nitride as deposited by LPCVD and its thickness is preferably between 1000 Angstroms and 3000 Angstroms. It should be noted that a first anti-reflection coating (ARC) layer (not shown) can be formed over the first masking dielectric layer 303 to act as a hard masking layer for patterning the first masking dielectric layer 303.

FIG. 2B shows that the first masking dielectric layer 303, the first conductive layer 302, and the first dielectric layer 301 outside of the plurality of masking photoresist PR1 are sequentially removed by using anisotropic dry etching; the semiconductor substrate 300 is then anisotropically etched to form first-type shallow trenches, and the plurality of masking photoresist PR1 are then stripped; and subsequently, the first-type shallow trenches are refilled with first-type planarized field-oxide layers 304a. The depth of the first-type shallow trenches in the semiconductor substrate 300 is between 4000 Angstroms and 15000 Angstroms. The first-type planarized field-oxide layer 304a is preferably made of silicon-oxide, phosphosilicate glass (p-glass), boro-phosphosilicate glass (BP-glass) as deposited by high-density plasma (HDP) CVD or plasma-enhanced (PE) CVD, and is formed by first depositing a thick-oxide film 304 to fill up each gap formed by the first-type shallow trenches and then planarizing the deposited thick-oxide film 304 using chemical-mechanical-polishing (CMP) with the first masking dielectric layer 303a as a polishing stop.

FIG. 2C shows that the first-type planarized field-oxide layers 304a are etched back to a depth equal to a thickness of the first masking dielectric layer 303a to form first-type first raised field-oxide layers 304b and then the first masking dielectric layers 303a are removed by using hot-phosphoric acid or anisotropic dry etching; and subsequently, a second masking dielectric layer 305 is formed over a flat surface being alternately formed by a first conductive layer 302a and a first-type first raised field-oxide layer 304b. The second masking dielectric layer 305 is preferably made of silicon-nitride as deposited by LPCVD and its thickness is preferably between 3000 Angstroms and 10000 Angstroms. The cross-sectional view along an active region as indicated by a C–C' line is shown in FIG. 3A.

Figure 3A:
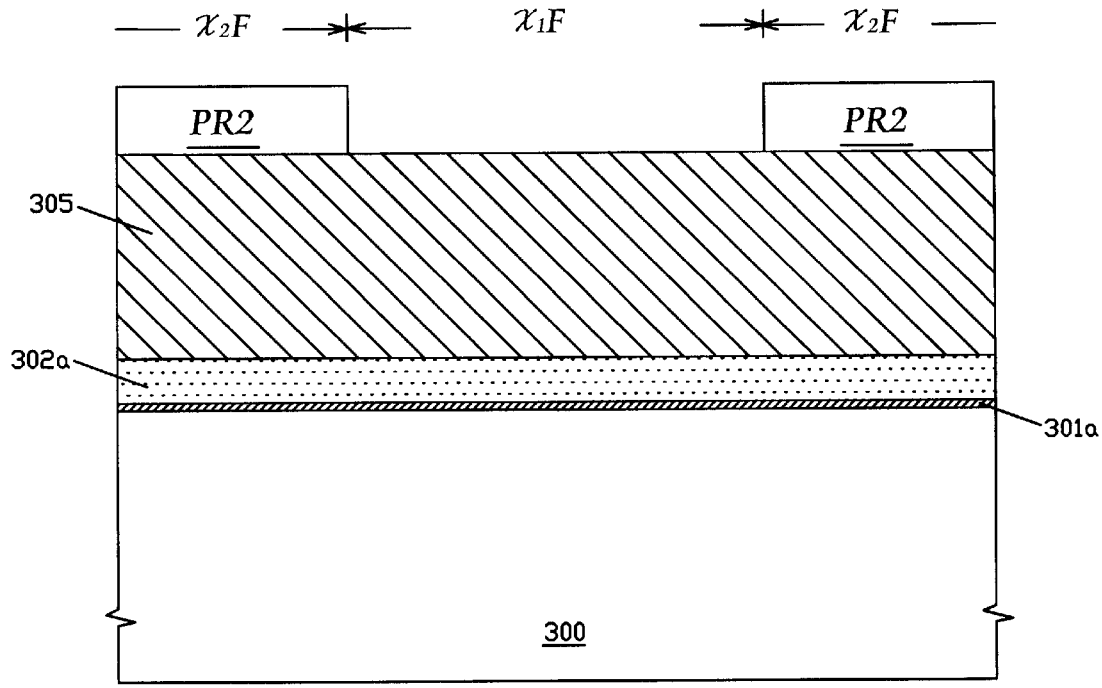
FIG. 3A through FIG. 3I show the process steps and their cross-sectional views of fabricating a self-aligned vertical transistor DRAM structure of the present invention.

Referring now to FIG. 3A through FIG. 3I, there are shown the process steps and their cross-sectional views of fabricating a self-aligned vertical transistor DRAM structure of the present invention on a first-type shallow-trench-isolation structure shown in FIG. 2C. FIG. 3A shows that a plurality of masking photoresist PR2 are formed over the second masking dielectric layer 305 to define a plurality of self-aligned trench regions (between PR2) and a plurality of self-aligned common-drain regions (under PR2). Each of the plurality of self-aligned trench regions includes a pair of deep-trench regions and a second-type shallow-trench region being located between the pair of deep-trench regions as indicated by $X_1F$. Each of the plurality of self-aligned common-drain regions includes a common-drain diffusion region as indicated by $X_2F$. Similarly, a second anti-reflection coating (ARC) layer (not shown) can be formed over the second masking dielectric layer 305 to act as a hard masking layer to pattern the second masking dielectric layer 305. The first/second anti-reflection coating (ARC) layer is preferably made of boro-silicate glass (B-glass) as deposited by HDPCVD, PECVD, APCVD, or LPCVD.

Figure 3B:
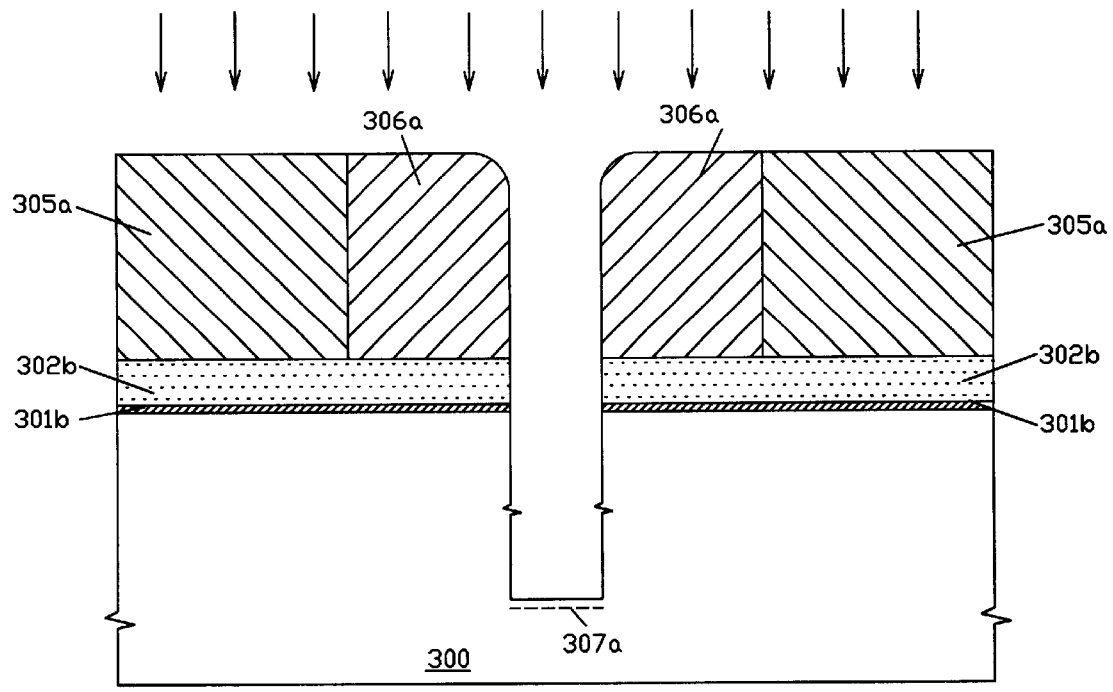

FIG. 3B shows that the second masking dielectric layer 305 outside of the plurality of masking photoresist PR2 are removed by anisotropic dry etching and the plurality of masking photoresist PR2 are stripped; a pair of first sidewall dielectric spacers 306a are then formed over each inner sidewall formed by the removed second masking dielectric layers 305 in each of the plurality of self-aligned trench regions; and subsequently, the first conductive layer 302a, and the first dielectric layer 301a between the pair of first sidewall dielectric spacers 306a are sequentially removed and the semiconductor substrate 300 in each of the plurality of active regions is anisotropically etched to form second-type shallow trenches in each of the plurality of self-aligned trench regions, and an ion-implantation can be preformed in a self-aligned manner to form an implant region 307a of a second conductivity type in each bottom semiconductor-surface region of the second-type shallow trenches. The first sidewall dielectric spacer 306a is preferably made of silicon-dioxide as deposited by LPCVD and is formed by first depositing a silicon-dioxide film 306 over the formed structure and then etching back a thickness of the deposited silicon-dioxide film 306.

Figure 3C:
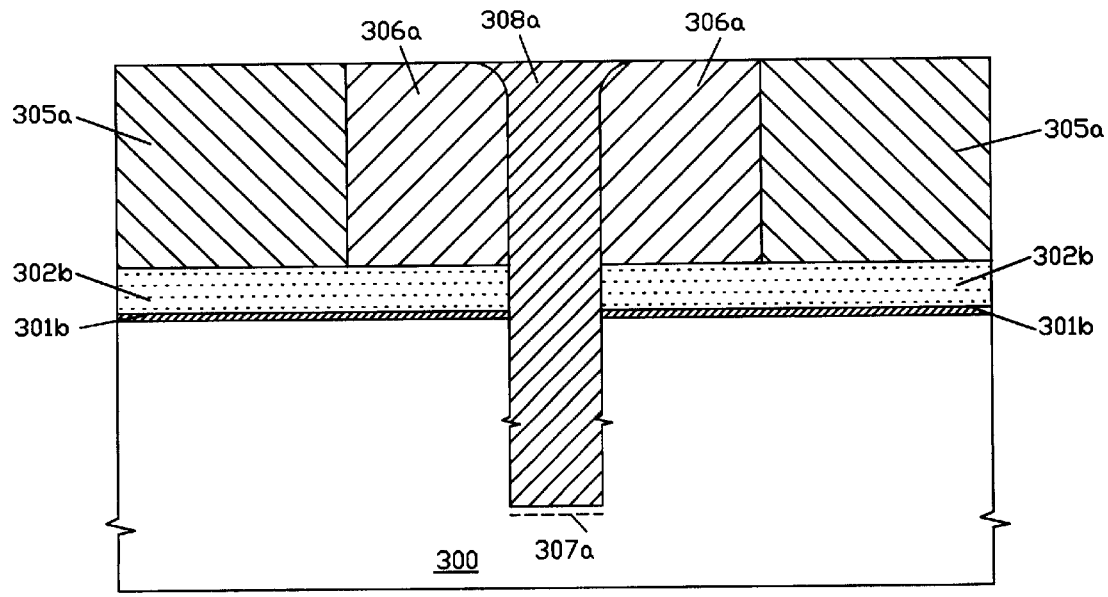

FIG. 3C shows that a second planarized field-oxide layer 308a is formed to fill up each gap between the pair of first sidewall dielectric spacers 306a. The second planarized field-oxide layer 308a is preferably made of silicon-dioxide as deposited by LPCVD and is formed by first depositing a silicon-dioxide film 308 to fill up each gap between the pair of first sidewall dielectric spacers 306a and then planarizing the deposited silicon-dioxide film 308 using CMP with the second masking dielectric layer 305a as a polishing stop.

Figure 3D:
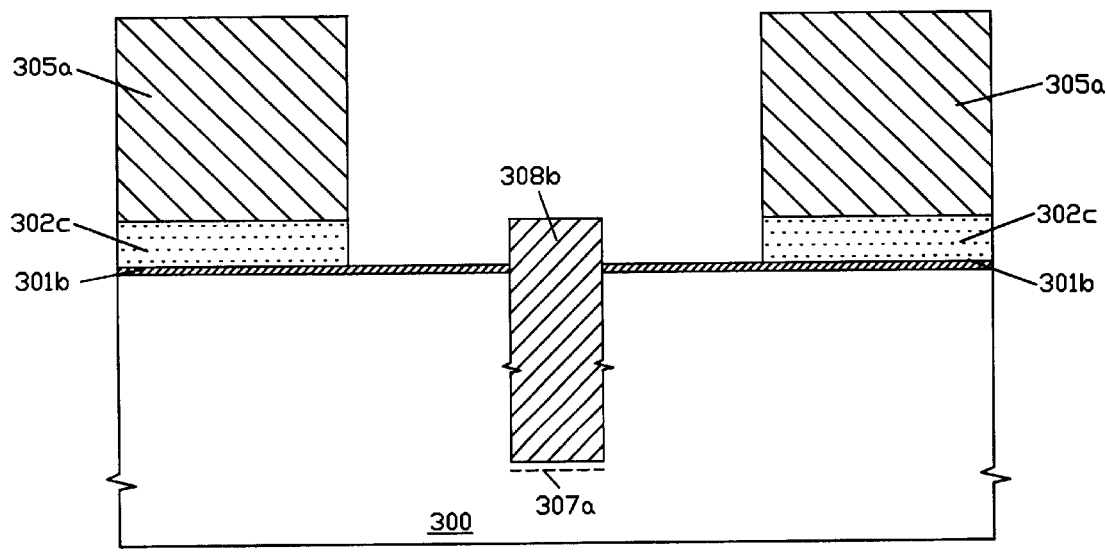

FIG. 3D shows that the pair of first sidewall dielectric spacers 306a and the second planarized field-oxide layers 308a are simultaneously etched back to a depth equal to a thickness of the second masking dielectric layer 305a or are etched by a wet etching solution such as buffered hydrofluoric acid to form second-type first raised field-oxide layers 308b; and subsequently, the first conductive layers 302b in each of the plurality of self-aligned trench regions are selectively removed by using anisotropic dry etching.

Figure 3E:
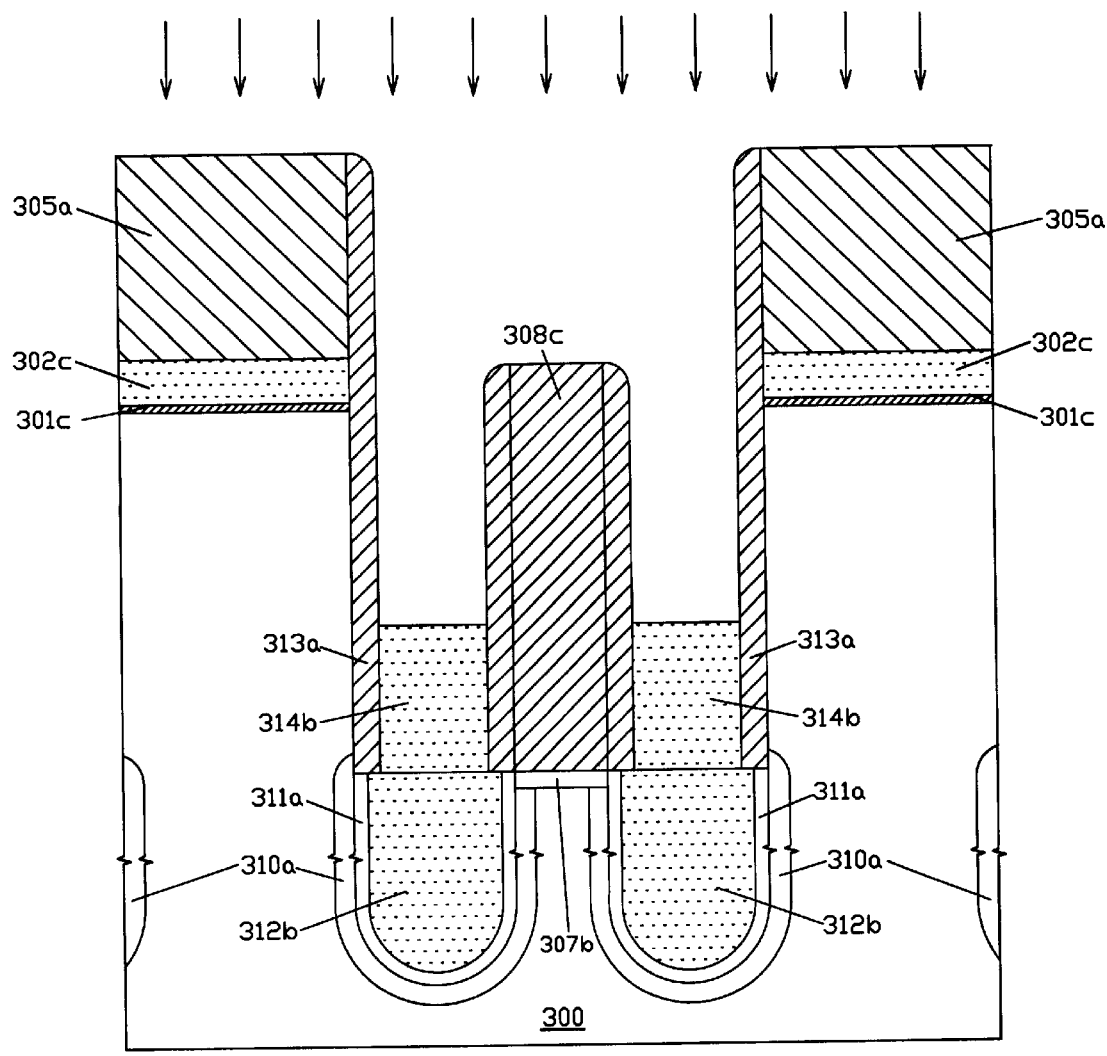

FIG. 3E shows that the first dielectric layers 301b are selectively removed first by anisotropic dry etching, and the second-type first raised field-oxide layers 308b and the first-type first raised field-oxide layers 304b are simultaneously etched to form second-type second raised field-oxide layers 308c and first-type second raised field-oxide layers 304c respectively, a plurality of deep trenches are then formed in the semiconductor substrate 300 of the plurality of active regions in each of the plurality of self-aligned trench regions, and thereafter a lower capacitor node 310a is formed over each lower portion of the deep trenches. The lower capacitor node 310a is a heavily-doped n+ diffusion region formed by an arsenic-silicate glass (ASG) film as a dopant diffusion source and can be formed by depositing an arsenic-silicate glass film over a whole structure surface including the sidewalls of the deep trenches, and a photoresist is formed and is then etched back to a level approximately equal to a bottom surface of the second-type second raised field-oxide layer 308c; and subsequently, the arsenic-silicate glass film above the etched-back photoresist is removed by dipping in dilute hydrofluoric acid and the etched-back photoresist are then stripped; and thereafter, a thin capping silicon-dioxide layer is deposited over the formed structure surface including the arsenic-silicate glass films formed in the lower portion of the deep trenches and the upper portion of the deep trenches, and a drive-in process is performed to form the lower capacitor nodes 310a; the thin capping silicon-dioxide layer and the arsenic-silicate glass films are then removed by dipping in dilute hydrofluoric acid. It should be noted that the thin capping silicon-dioxide layer is mainly used to eliminate out-diffusion of dopant impurities in the arsenic-silicate glass films during the drive-in process.

FIG. 3E also shows that a capacitor-dielectric layer 311 is formed over the formed structure surface and an upper capacitor node 312b is formed in each of the plurality of deep trenches. The capacitor-dielectric layer 311 is preferably a composite dielectric layer such as an oxide-nitride-oxide structure or a nitride-oxide (NO) structure. The upper capacitor node 312b is preferably made of doped polycrystalline-silicon and can be further implanted with a high dose of doping impurities of the second conductivity type (not shown), which is formed by first depositing a thick second conductive layer 312 to fill up each gap in each of the plurality of self-aligned trench regions and then planarizing the deposited thick second conductive layer 312 using CMP with the capacitor-dielectric layer 311 as a polishing stop to form planarized second conductive layers 312a and thereafter etching back the planarized second conductive layers 312a to a level approximately equal to a bottom surface of the second-type second raised field-oxide layers 308c to form the upper capacitor nodes 312b.

FIG. 3E further shows that the capacitor-dielectric layers 311 above the upper capacitor nodes 312b are removed preferably by wet-chemical solution and a collar-oxide spacer 313a together with a capacitor-node conductive layer 314b are formed in each of the plurality of deep trenches. The collar-oxide spacer 313a is formed by first depositing a silicon-dioxide film 313 over the formed structure surface and then etching back a thickness of the deposited silicon-dioxide film 313 to form a sidewall silicon-dioxide spacer 313a over each inner sidewall formed in each of the plurality of deep trenches; a planarized third conductive layer 314a is then formed to fill up a gap formed in each of the plurality of self-aligned trench regions and is etched back to a predetermined depth to form a capacitor-node conductive layer 314b; and an ion-implantation can be performed by implanting doping impurities of the second conductivity type to heavily dope the capacitor-node conductive layer 314b.

Figure 3F:
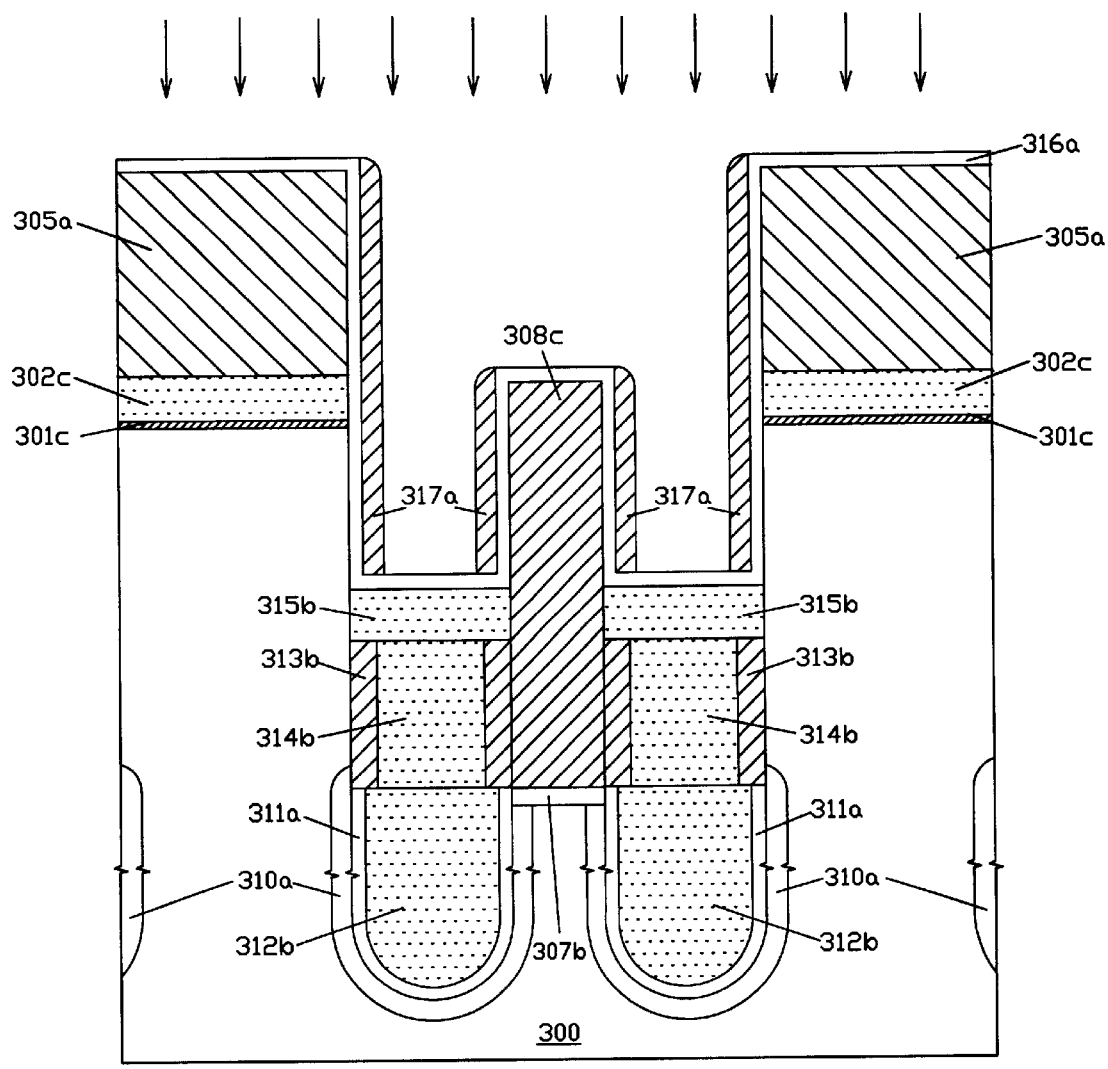

FIG. 3F shows that the sidewall silicon-dioxide spacers 313a above the capacitor-node conductive layer 314b in each of the plurality of deep trenches are removed, and a source conductive layer 315b is then formed over the collar-oxide layer 313b and the capacitor-node conductive layer 314b. The source conductive layer 315b is preferably made of doped polycrystalline-silicon or intrinsic polycrystalline-silicon and is formed by first depositing a thick fourth conductive film 315 to fill up a gap formed in each of the plurality of self-aligned trench regions and then planarizing the deposited thick fourth conductive layer 315 using CMP with the second masking dielectric layer 305a as a polishing stop to form a planarized fourth conductive layer 315a in each of the plurality of self-aligned trench regions, and the planarized fourth conductive layers 315a are then etched back to form the source conductive layers 315b.

FIG. 3F also shows that a thin capping silicon-dioxide layer 316 is formed over the formed structure surface; a thin capping silicon-nitride layer 317 is formed over the thin capping-silicon dioxide layer 316 and is then etched back to a thickness of the deposited thin capping silicon-nitride layer 317 to form thin capping silicon-nitride spacers 317a over each sidewall of the thin capping silicon-dioxide layer 316 in each of the plurality of self-aligned trench regions; and an ion-implantation is performed by implanting a high dose of doping impurities of the second conductivity type across the thin capping silicon-dioxide layer 316a into the source conductive layers 315b. The thin capping silicon-dioxide layer 316 is preferably deposited by LPCVD or a high-temperature oxide (HTO) deposition and its thickness is preferably between 50 Angstroms and 150 Angstroms. The thin capping silicon-nitride layer 317 is preferably deposited by LPCVD and its thickness is preferably between 50 Angstroms 300 Angstroms. It should be noted that the thin capping silicon-dioxide layer 316 and the thin capping silicon-nitride layer 317 serve two purposes: a first purpose is to prevent the trench sidewall from ion-implantation; and a second purpose is to prevent the trench sidewall from oxidation and stress-induced defects in a later process.

Figure 3G:
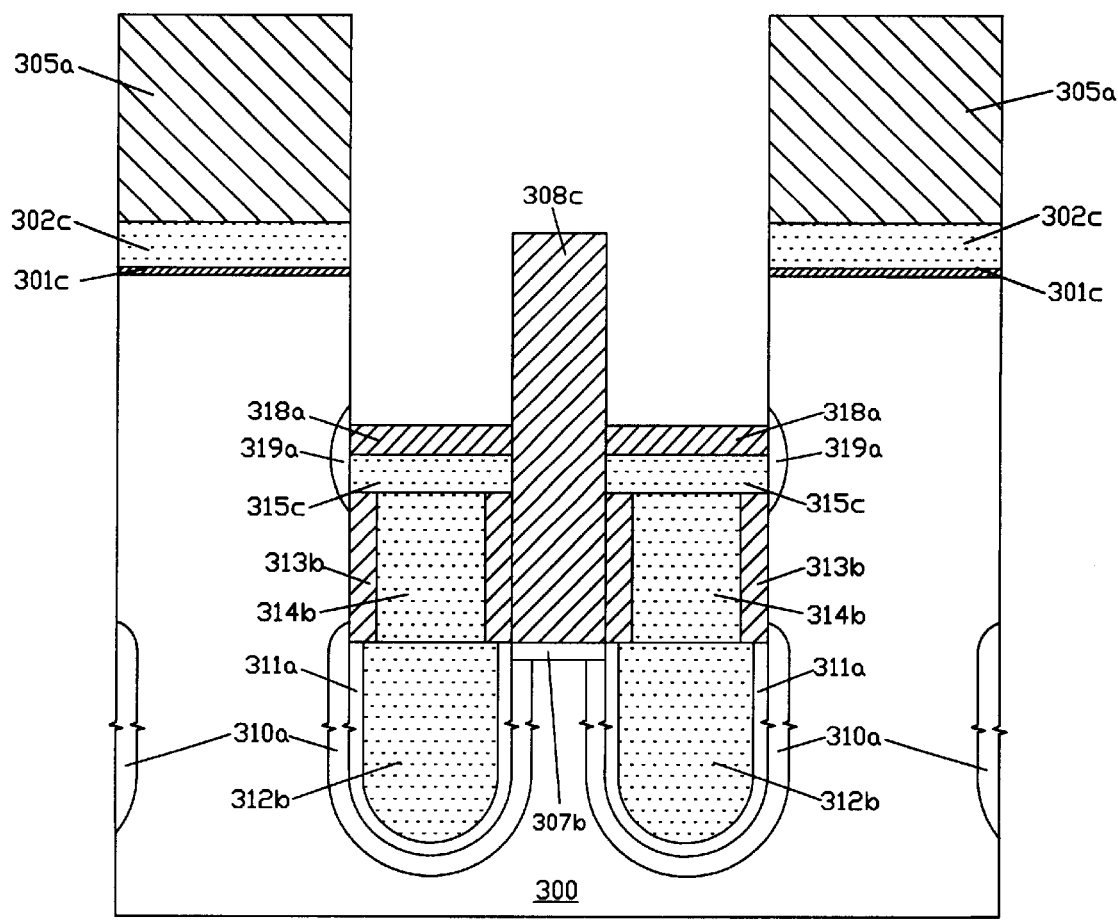

FIG. 3G shows that a thermal oxidation process is performed to form an isolation silicon-dioxide layer 318a over the source conductive layer 315b and the implanted doping impurities in the source conductive layer 315b are simultaneously diffused into a side portion of the semiconductor substrate 300 near the source conductive layer 315b to form a common-source diffusion region 319a; and subsequently, the thin capping silicon-nitride spacers 317a are removed by hot-phosphoric acid and then the thin capping silicon-dioxide layers 316 are selectively removed by dipping in a dilute hydrofluoric solution or using isotropic dry etching. The thickness of the isolation silicon-dioxide layer 318a is preferably between 500 Angstroms and 1500 Angstroms. Therefore, the thickness of the source conductive layer 315b is preferably between 1000 Angstroms and 1500 Angstroms.

Figure 3H:
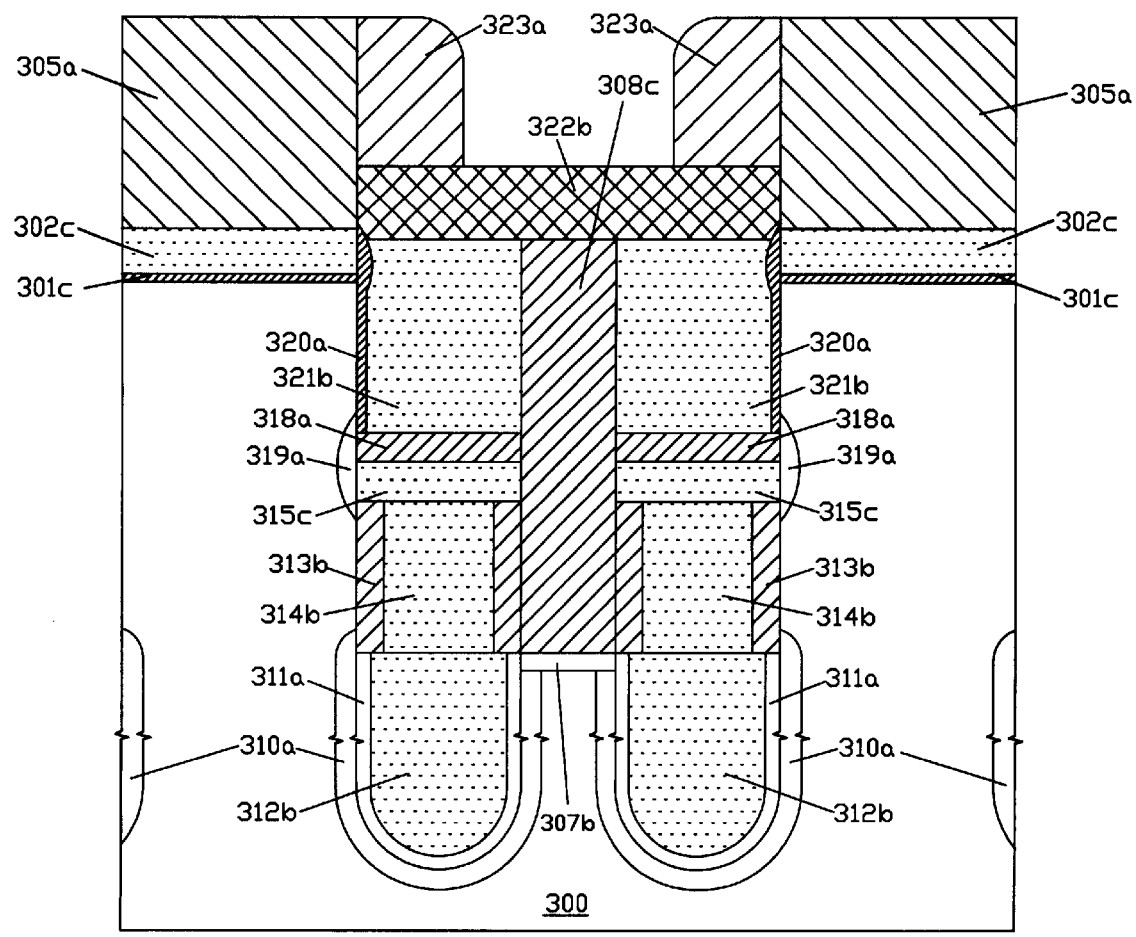
Figure 3H:
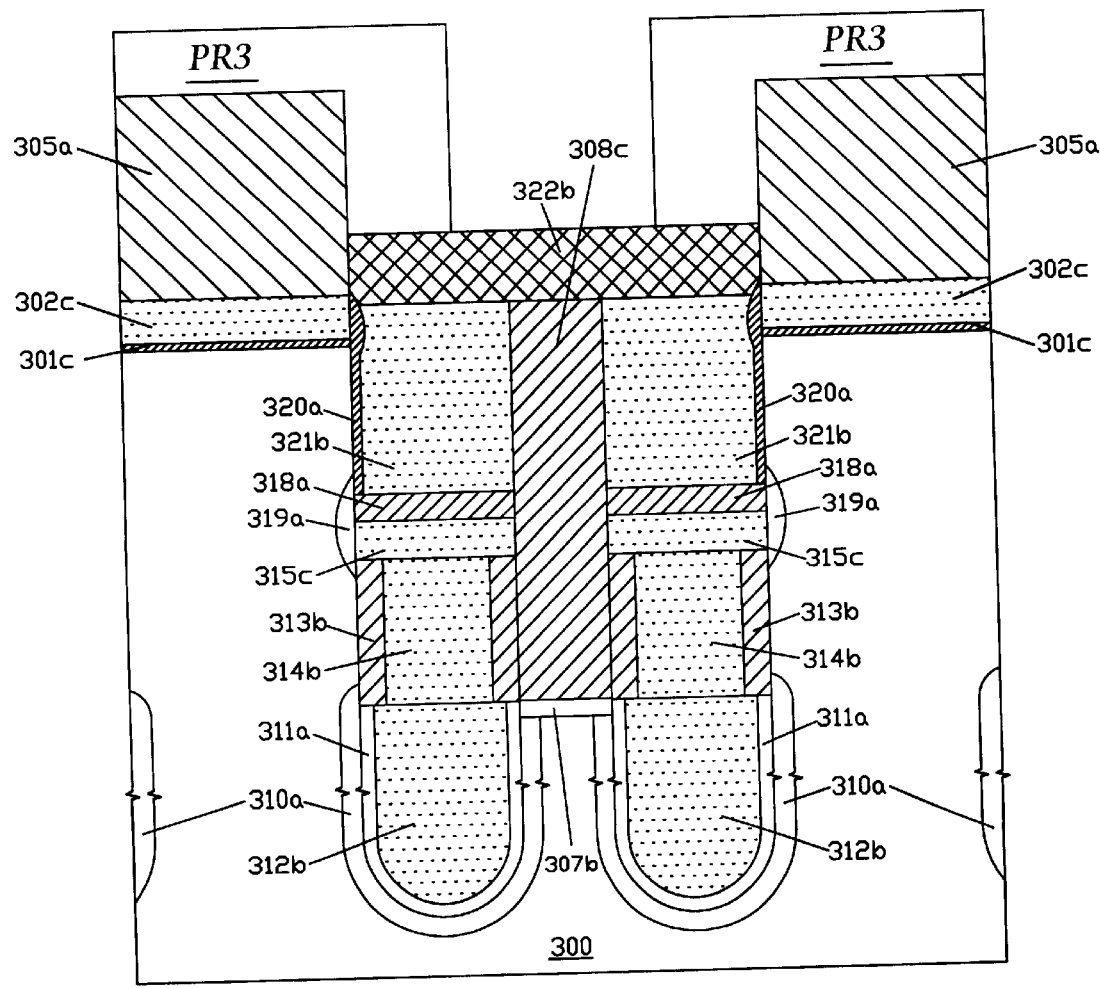

FIG. 3H(a) shows that a gate-dielectric layer 320a is formed over each exposed trench sidewall by a well-known thermal oxidation process and a thicker poly-oxide layer is formed over each sidewall of the first conductive layers 302c; and subsequently, a planarized fifth conductive layer 321a is formed to fill up a gap in each of the plurality of self-aligned trench regions and is then etched back to a depth approximately equal to a top level of the second-type second raised field-oxide layer 308c to form a conductive-gate layer 321b in each of the plurality of deep trenches. The conductive-gate layer 321b is preferably made of doped polycrystalline-silicon as deposited by LPCVD and is further implanted with a high-dose of doping impurities of the second conductivity type. The planarized fifth conductive layer 321a is planarized by using CMP with the second masking dielectric layer 305a as a polishing stop.

FIG. 3H(a) also shows that a capping conductive layer 322b is formed over the conductive-gate layers 321b by a similar planarization and etching-back process as that used to form the conductive-gate layer 321b and a pair of second sidewall dielectric spacers 323a are then formed over each sidewall of nearby second masking dielectric layers 305a and on the capping conductive layer 322b in each of the plurality of self-aligned trench regions. The capping conductive layer 322b is preferably comprised of tungsten-disilicide ($WSi_2$) or tungsten (W) as deposited by LPCVD or sputtering. The second sidewall dielectric spacer 323a is preferably made of silicon-dioxide as deposited by LPCVD.

FIG. 3H(b) shows that the conductive-gate layers 321b and the capping conductive layer 322b are formed by the processes as discussed in FIG. 3H(a) and a plurality of masking photoresist PR3 are then formed over the plurality of self-aligned common-drain regions and a portion of the plurality of self-aligned trench regions.

Figure 3I:
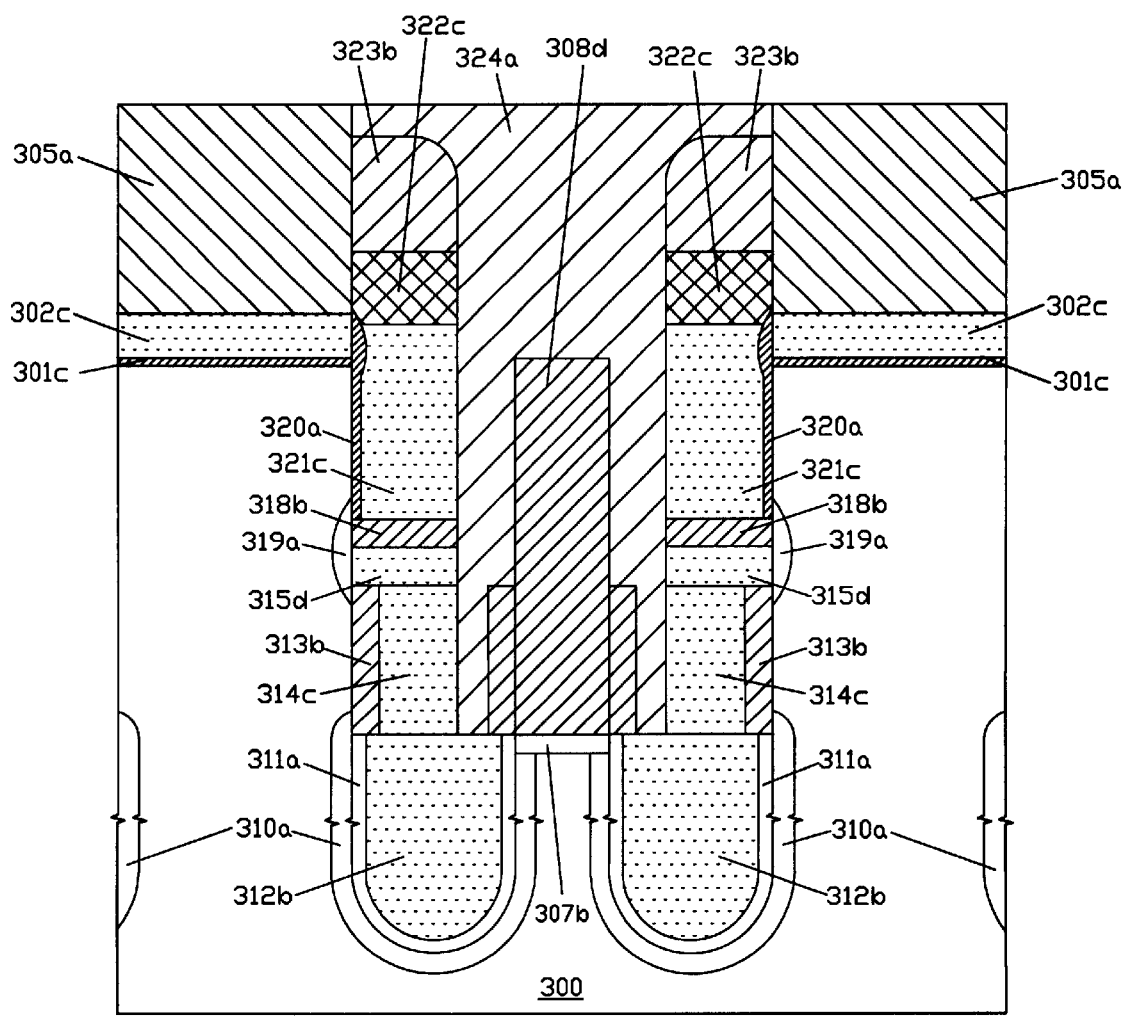
Figure 3I:
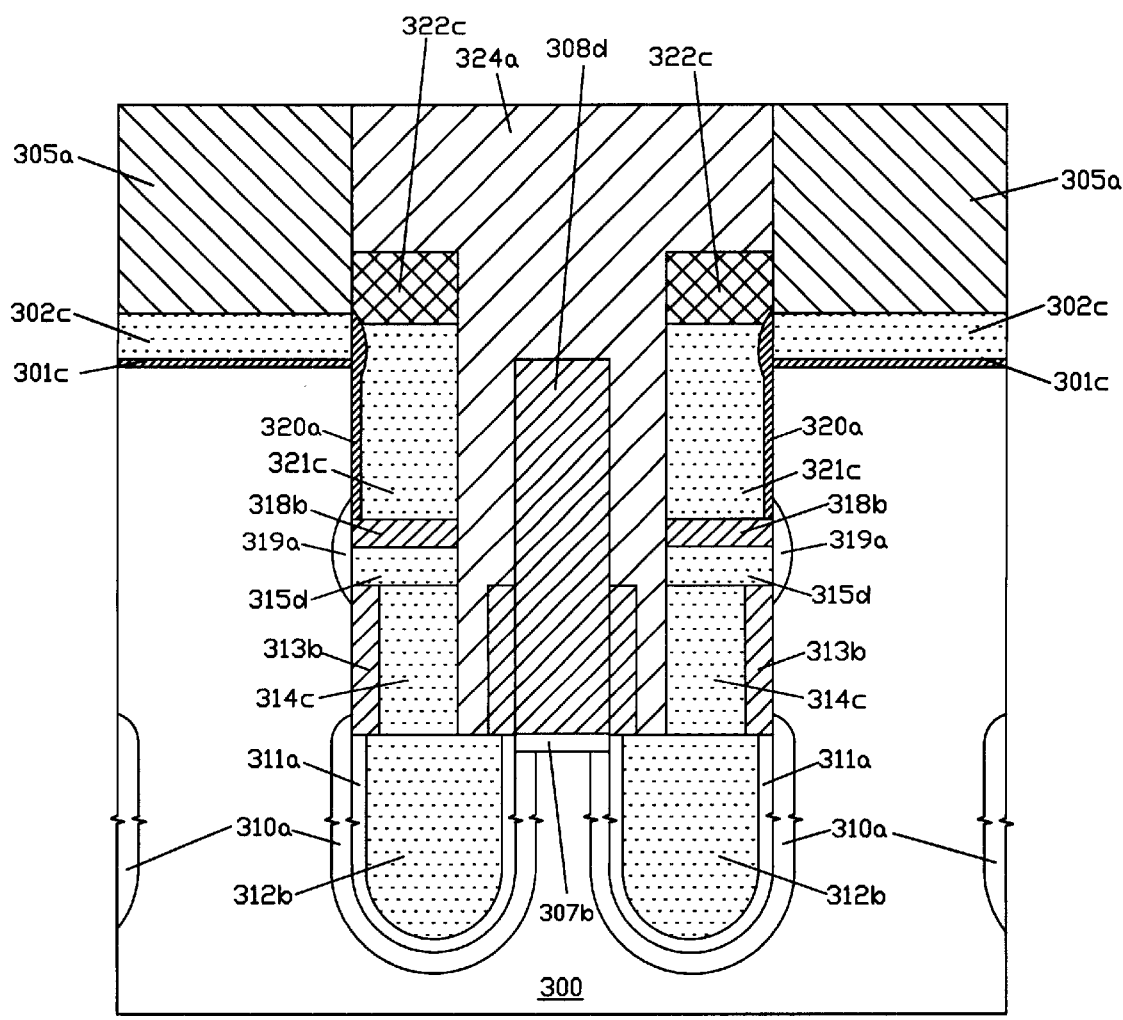

FIG. 3I(a) and FIG. 3I(b) show that the capping conductive layer 322b, the conductive-gate layers 321b, the isolation silicon-dioxide layers 318a, the source conductive layers 315c, and the capacitor-node conductive layers 314b between the pair of second sidewall dielectric spacers 323a as shown in FIG. 3H(a) or the plurality of masking photoresist PR3 as shown in FIG. 3H(b) in each of the plurality of self-aligned trench regions are sequentially removed by using anisotropic dry etching, and the second-type second raised field-oxide layers 308c and the first-type second raised field-oxide layers 304c between the pair of second sidewall dielectric spacers 323a in FIG. 3H(a) and the plurality of masking photoresist PR3 in FIG. 3H(b) and the pair of second sidewall dielectric spacers 323a are etched during removing the isolation silicon-dioxide layers 318a.

FIG. 3I(a) also shows that a first planarized thick-oxide layer 324a is formed over a gap formed in each of the plurality of self-aligned trench regions. Similarly, FIG. 3I(b) also shows that after stripping the plurality of masking photoresist PR3, a first planarized thick-oxide layer 324a is also formed over a gap formed in each of the plurality of self-aligned trench regions. The first planarized thick-oxide layer 324a is preferably made of silicon-oxide, P-glass, or BP-glass as deposited by HDPCVD or PECVD and is formed by first depositing a thick-oxide film 324 to fill up a gap formed in each of the plurality of self-aligned trench regions and then planarizing the deposited thick-oxide film 324 using CMP with the second masking dielectric layer 305a as a polishing stop.

From FIG. 3I(a) and FIG. 3I(b), it is clearly seen that both structures are quite similar, however, a masking photoresist step is not required for FIG. 3I(a) and misalignment doesn't occur for FIG. 3I(a). It should be emphasized that a first masking structure of the present invention having a doped polycrystalline-silicon or amorphous-silicon layer 302 formed over a thin thermal-oxide or nitrided thermal-oxide layer 301 to act as a stress-relief buffer layer may reduce the undercut effect as compared to a pad-oxide layer used in the prior art and a thicker poly-oxide layer being formed over a sidewall of the first conductive layer 302c may reduce the overlapping capacitance between the conductive-gate node 321c and the drain. In the following process steps shown in FIG. 4 and FIG. 5, the first planarized thick-oxide layer 324a together with the pair of second sidewall dielectric spacers 323b are mixed together to become a mixed planarized thick-oxide layer as marked by 324a/323b.

Figure 4A:
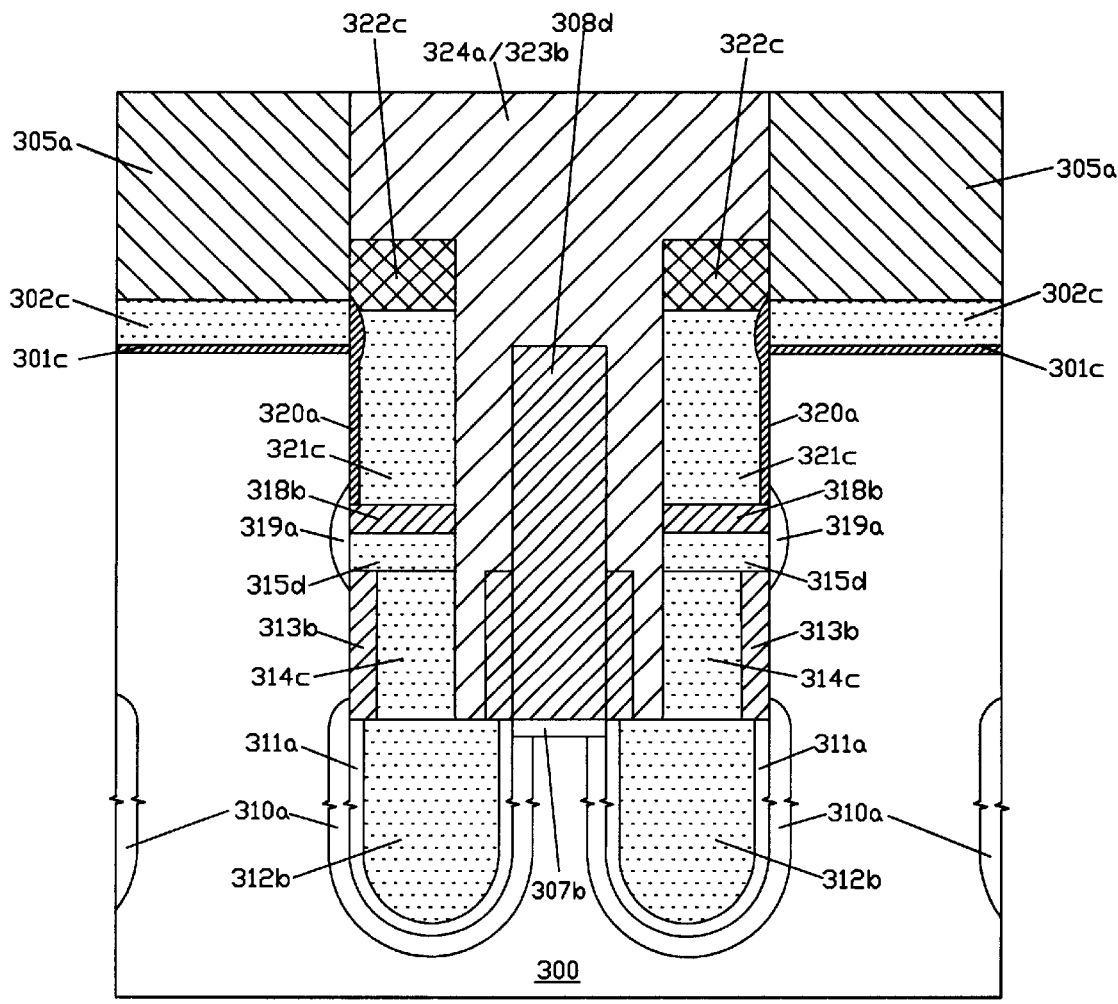
FIG. 4A through FIG. 4D show the process steps and their cross-sectional views of fabricating a self-aligned vertical transistor DRAM structure and its first-type contactless DRAM array of the present invention.

Referring now to FIG. 4A through FIG. 4D, there are shown the process steps and their cross-sectional views for forming a first-type contactless vertical transistor DRAM array. FIG. 4A shows a plot of FIG. 3I(a) and FIG. 3I(b) with a mixed planarized thick-oxide layer 324a/323b.

Figure 4B:
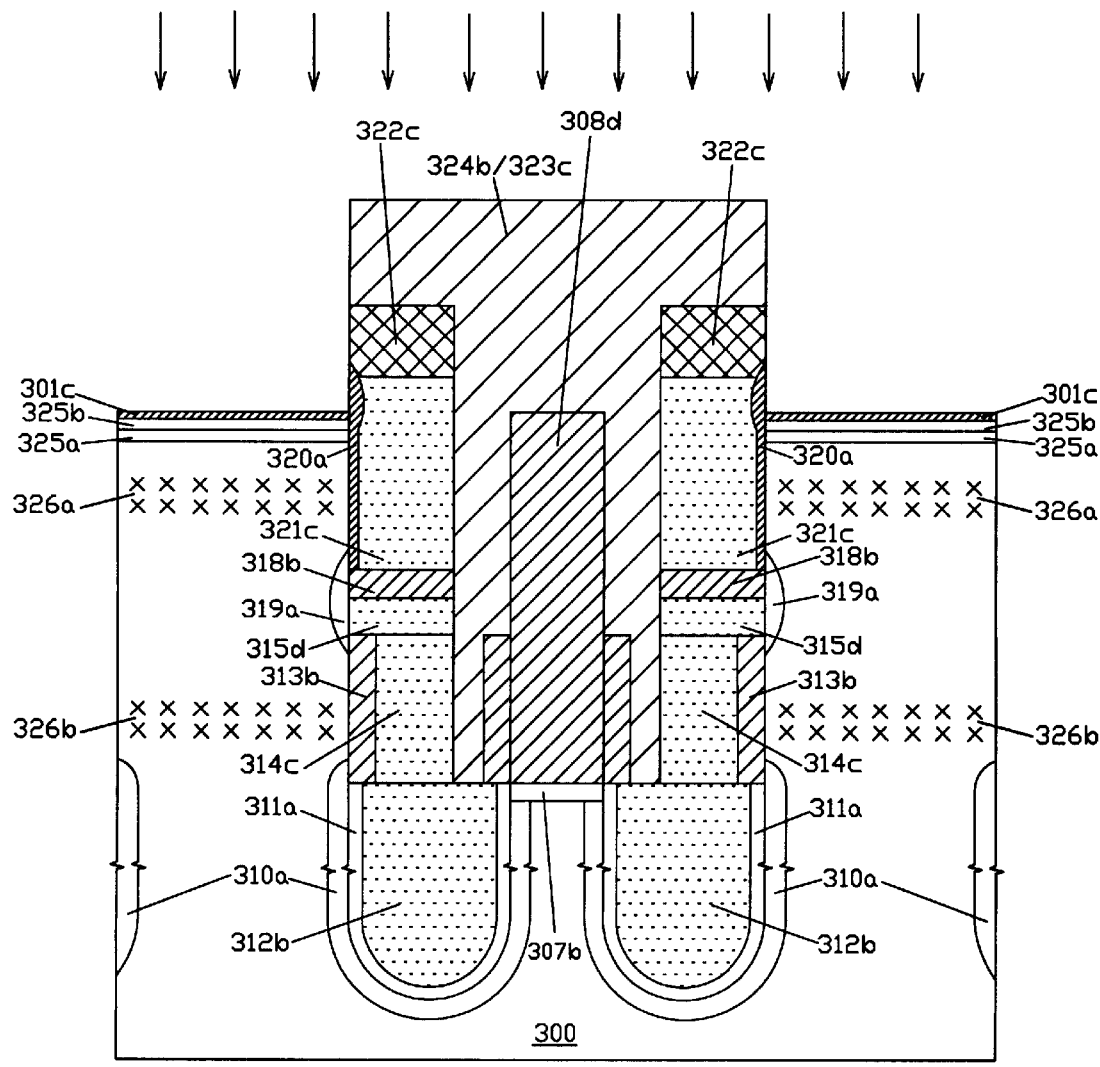

FIG. 4B shows that the second masking dielectric layer 305a in each of the plurality of self-aligned common-drain regions is selectively removed by hot-phosphoric acid or anisotropic dry etching, and the first-type first raised field-oxide layers 304b in each of the plurality of self-aligned common-drain regions and the mixed planarized thick-oxide layer 324a/323b in each of the plurality of self-aligned trench regions are etched back to a depth equal to a thickness of the first conductive layer 302c by using anisotropic dry etching; and subsequently, the first conductive layers 302c are selectively removed by using anisotropic dry etching, and different ion-implantations are preformed in a self-aligned manner by including a common-drain diffusion region 325a/325b of the second conductive type, a deep implant region 326a of the first conductivity type for both threshold-voltage adjustment and punch-through stop formation of the vertical transistor, and a deeper implant region 326b of the first conductivity type for forming a punch-through stop of the parasitic collar-oxide transistor in each active region. The common-drain diffusion region 325a/325b comprises a shallow heavily-doped diffusion region 325b being formed within a lightly-doped diffusion region 325a. It is clearly seen that the gate length of the vertical transistor and the gate length of the parasitic collar-oxide transistor can be much reduced without considering the short-channel effects produced by the vertical transistor and the parasitic collar-oxide transistor. As a consequence, the depth of the deep trenches can be made to be shallower by the present invention and the turn-on current of the vertical transistor can be made to be larger for a shorter channel length by the present invention.

Figure 4C:
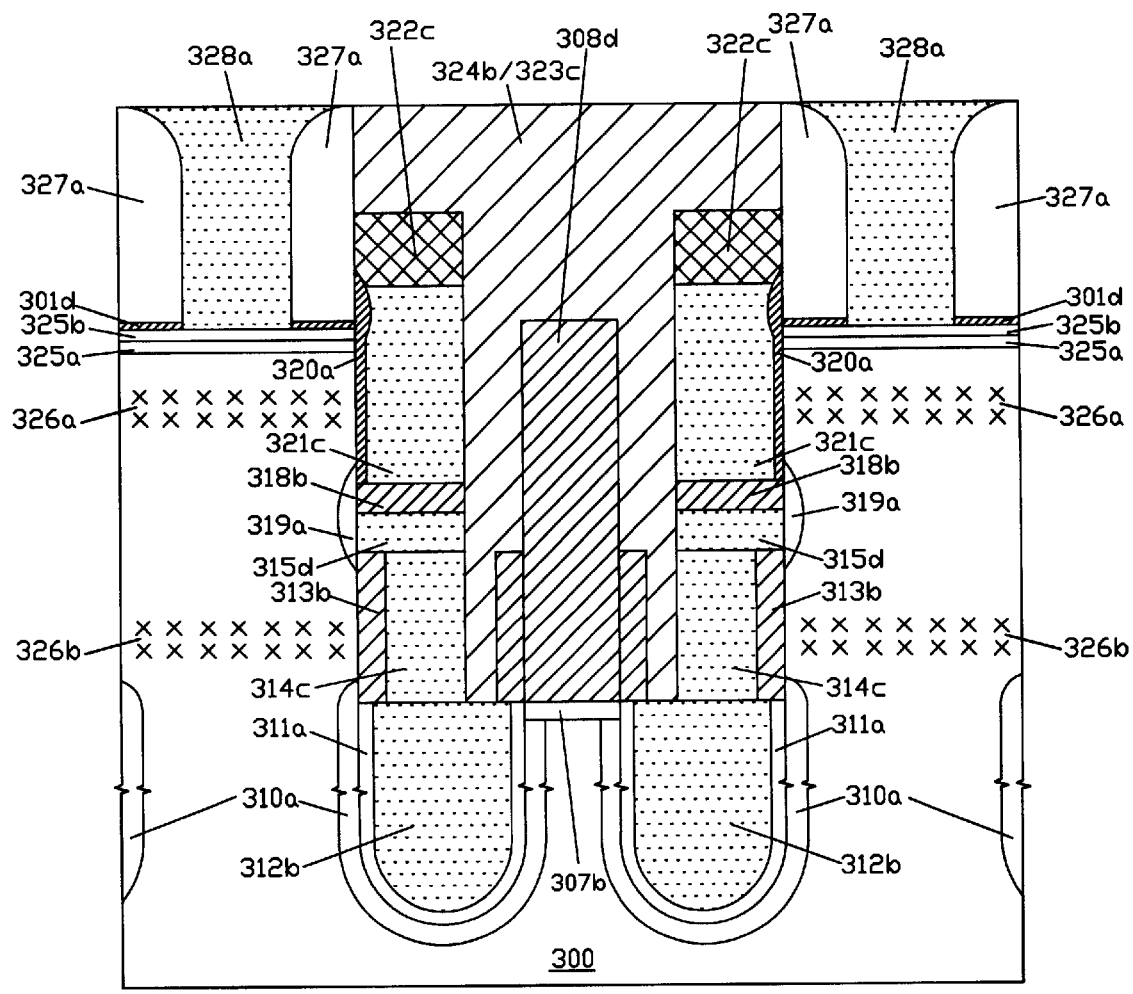

FIG. 4C shows that a pair of third sidewall dielectric spacers 327a are formed over each inner sidewall of nearby mixed planarized thick-oxide layers 324b/323c, and the first dielectric layers 301c between the pair of third sidewall dielectric spacers 327a are removed and the first-type fourth raised field-oxide layers 304e are etched to form first-type fifth raised field-oxide layers 304f; and subsequently, a planarized sixth conductive layer 328a is formed over a flat bed between the pair of third sidewall dielectric spacers 327a in each of the plurality of self-aligned common-drain regions. The planarized sixth conductive layer 328a is preferably made of doped polycrystalline-silicon and can be further implanted with a high dose of doping impurities of the second conductivity type, which can be formed by first depositing a thick sixth conductive layer 328 to fill up a gap formed between the pair of third sidewall dielectric spacers 327a and then planarizing by using CMP or etching back. The third sidewall dielectric spacer 327a is preferably made of silicon-oxide, silicon-nitride, or silicon-oxynitride as deposited by LPCVD. The flat bed is alternately formed by the common-drain diffusion region 325a/325b and the first-type fifth raised field-oxide layer 304f.

Figure 4D:
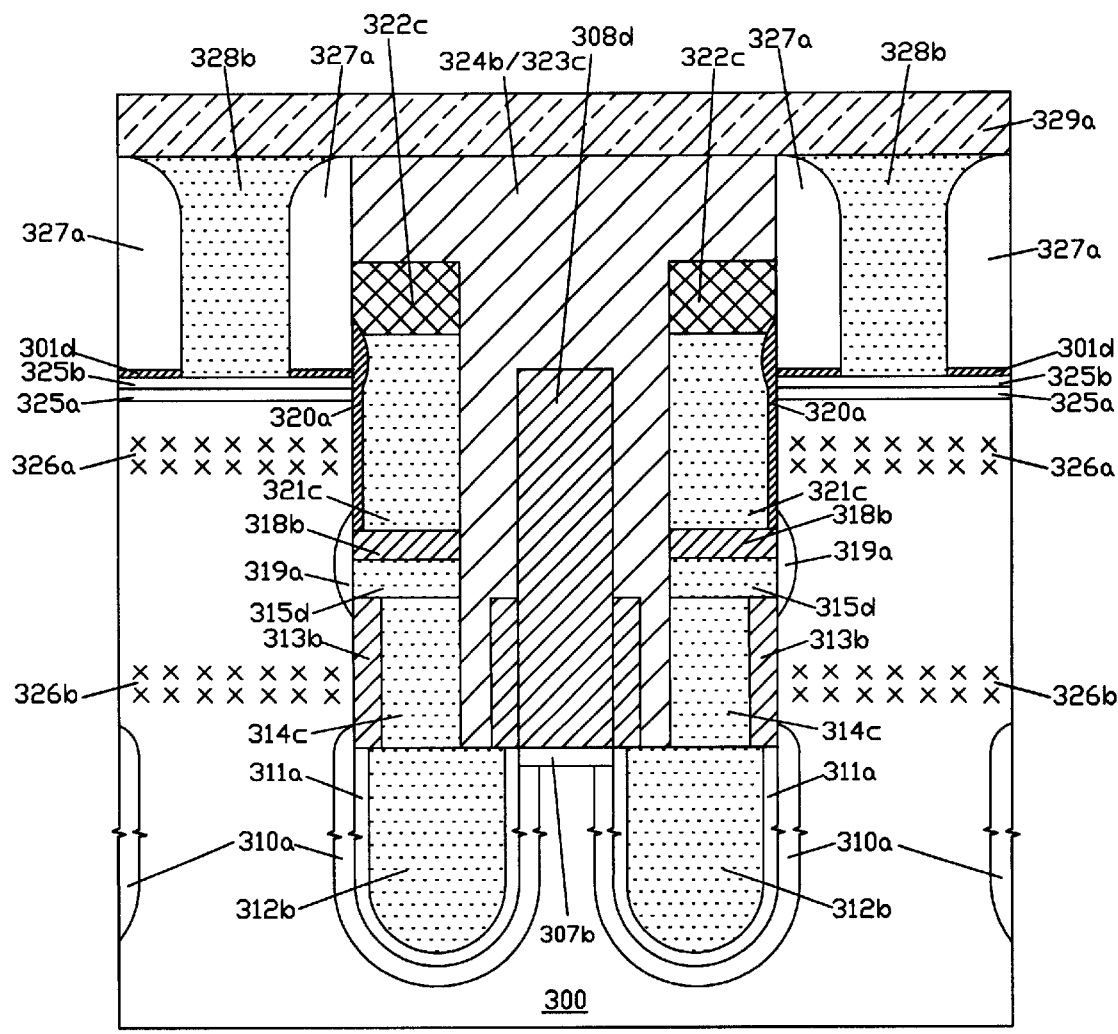

FIG. 4D shows that a metal layer 329 is formed over the planarized structure surface shown in FIG. 4C, and the metal layer 329 and the planarized sixth conductive layers 328a are simultaneously patterned and etched to form a plurality of metal bit-lines 329a integrated with planarized common-drain conductive islands 328b by using a photo-masking step. It should be noted that the planarized common-drain conductive island 328b may comprise a planarized heavily-doped polycrystalline-silicon island being silicided with a refractory metal-silicide layer such as a titanium-disilicide ($TiSi_2$) or cobalt-disilicide ($CoSi_2$) layer. The metal layer 329a may comprise an aluminum (Al) or copper (Cu) layer over a barrier-metal layer such as a titanium-nitride (TiN) or tantalum-nitride (TaN) layer. The photo-masking step may comprise a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers to eliminate misalignment.

Figure 4E:
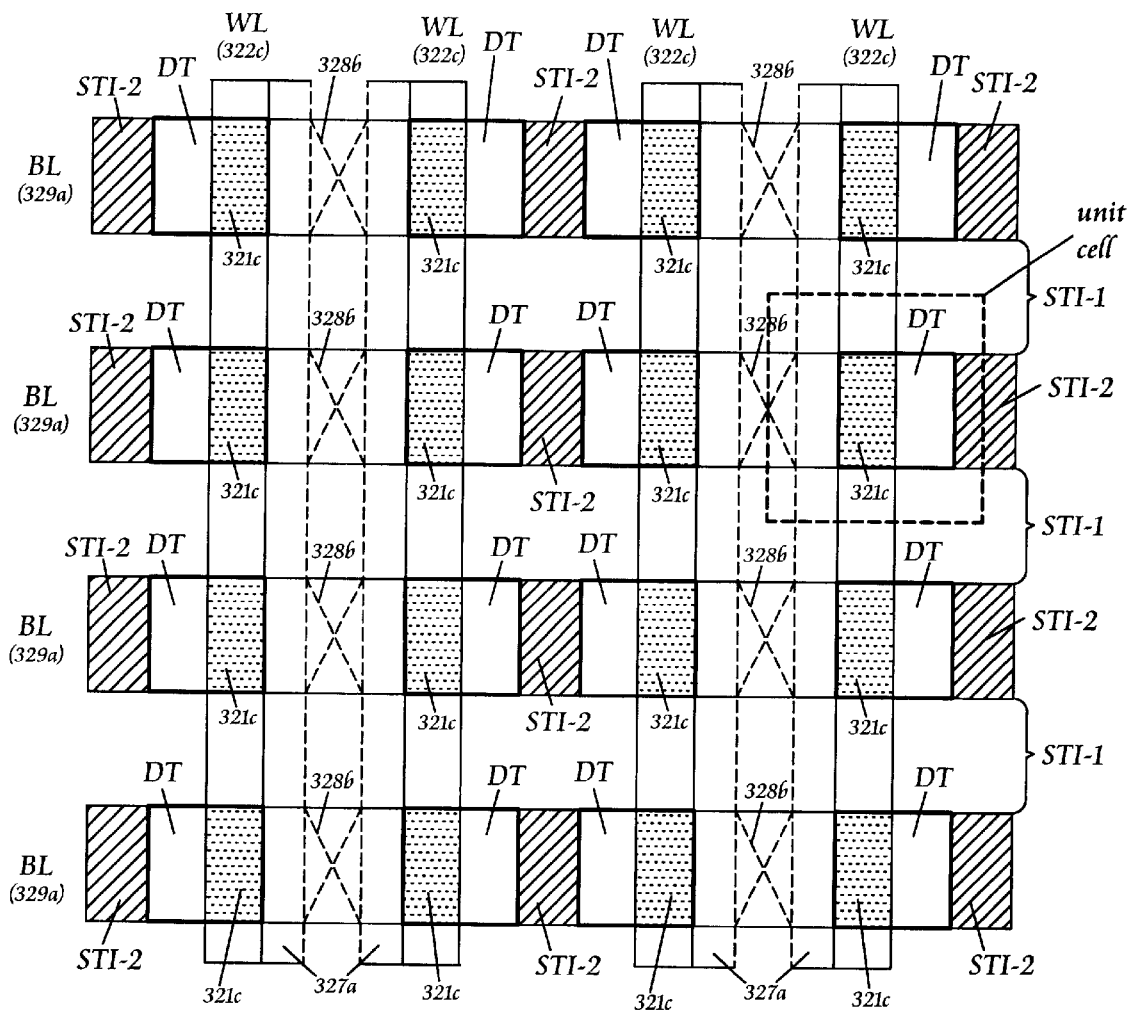
FIG. 4E shows a top plan view of a first-type contactless DRAM array of the present invention.

FIG. 4E shows a top plan view of the first-type contactless vertical transistor DRAM array of the present invention, in which a plurality of metal bit-lines (BL) 329a integrated with planarized common-drain conductive islands 328b are formed transversely to a plurality of conductive word-lines (WL) 322c; a plurality of first-type STI regions (STI-1) are formed alternately and are located transversely to the plurality of conductive word-lines (WL) 322c; a second-type STI region (STI-2) is formed between a pair of deep trenches (DT); and each of the plurality of conductive word-lines is integrated with the conductive-gate nodes 321c being formed in each of the plurality of deep trenches (DT). The unit cell size of a first-type contactless vertical transistor DRAM cell of the present invention as masked by a dash square is scalable and can be made to be equal to or smaller than $4F^2$.

Figure 5A:
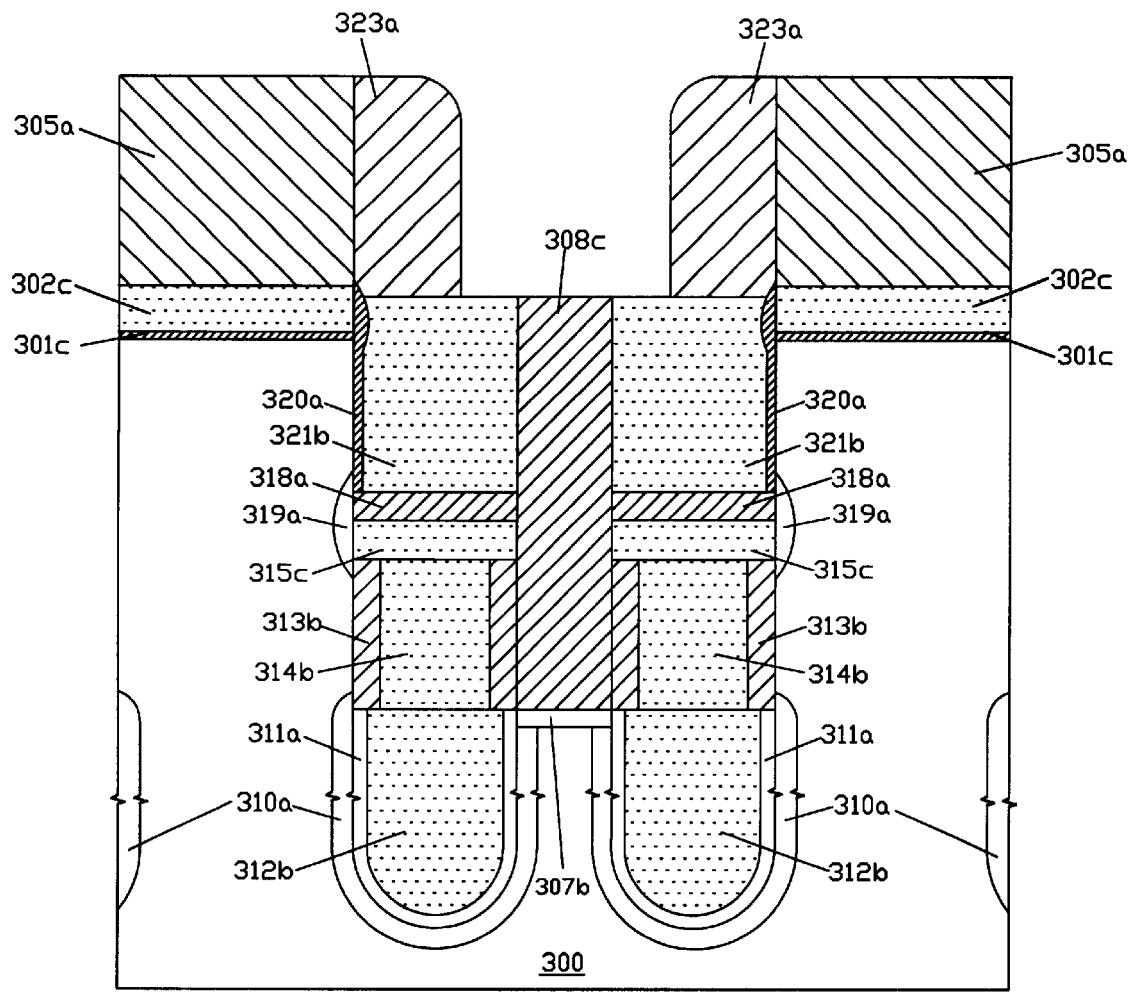
FIG. 5A through FIG. 5F show the process steps and their cross-sectional views of fabricating a self-aligned vertical transistor DRAM structure and its second-type contactless DRAM array of the present invention.

Referring now to FIG. 5A through FIG. 5F, there are shown the process steps and their cross-sectional views for forming a second-type contactless vertical transistor DRAM array of the present invention. FIG. 5A shows that after the formation of the conductive-gate layers 321b, a pair of second sidewall dielectric spacers 323a are formed over each outer sidewall of nearby second masking dielectric layers 305a in each of the plurality of self-aligned trench regions.

Figure 5B:
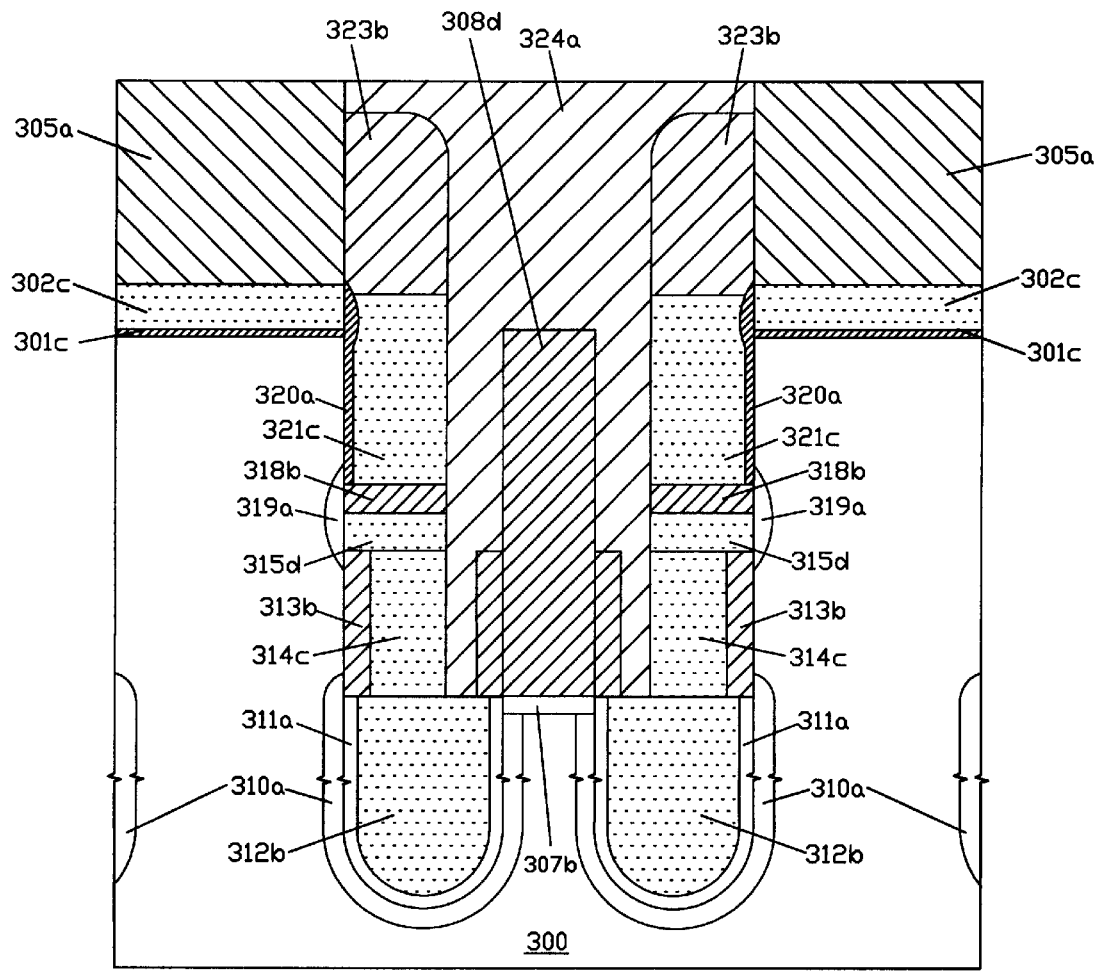

FIG. 5B shows that the conductive-gate layers 321b, the isolation silicon-dioxide layers 318a, the source conductive layers 315c, and the capacitor-node conductive layers 314b between the pair of second sidewall dielectric spacers 323a in each of the plurality of self-aligned trench regions are sequentially removed; and a first planarized thick-oxide layer 324a is formed to fill up a gap in each of the plurality of self-aligned trench regions.

Figure 5C:
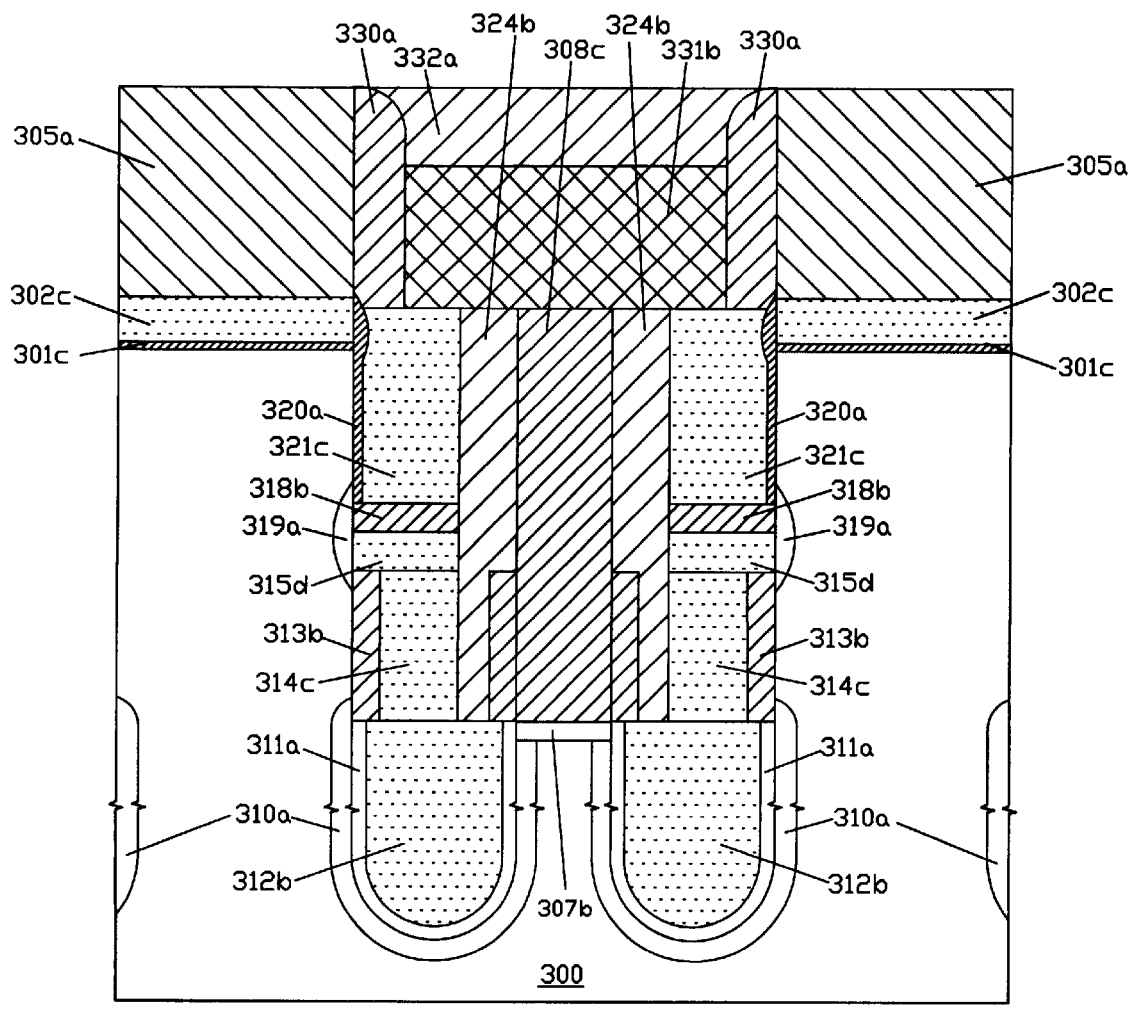

FIG. 5C shows that the first planarized thick-oxide layer 324a and the pair of second sidewall dielectric spacers 323b in each of the plurality of self-aligned trench regions are etched back to a top surface level of the conductive-gate nodes 321c, and a pair of fourth sidewall dielectric spacers 330a are formed over each outer sidewall of nearby second masking dielectric layers 305a; and subsequently, a planarized conductive layer 331a is formed between the pair of fourth sidewall dielectric spacers 330a in each of the plurality of self-aligned trench regions and is then etched back to a depth larger than a thickness of the first conductive layer 302c to form a planarized common-gate conductive layer 331b, and a planarized capping silicon-dioxide layer 332a is formed over the planarized common-gate conductive layer 331b in each of the plurality of self-aligned trench regions. The fourth sidewall dielectric spacer 330a is preferably made of silicon-oxide as deposited by LPCVD. The planarized conductive layer 331a is preferably made of tungsten-disilicide ($WSi_2$) or tungsten (W) as deposited by LPCVD or sputtering.

Figure 5D:
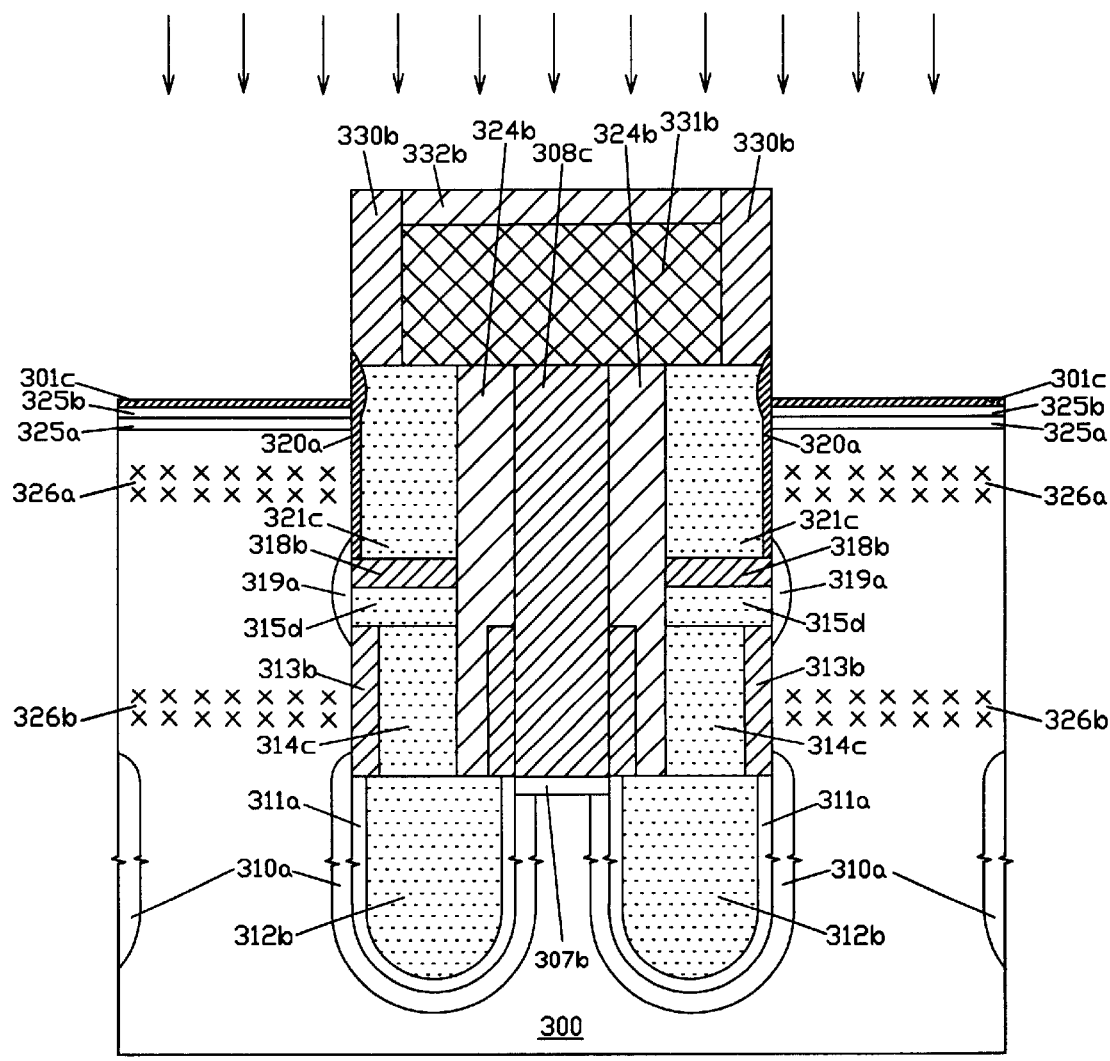

FIG. 5D shows that the second masking dielectric layer 305a in each of the plurality of self-aligned common-drain regions is selectively removed by using hot-phosphoric acid or anisotropic dry etching; and subsequently, the first-type first raised field-oxide layers 304b in each of the plurality of self-aligned common-drain regions together with the pair of fourth sidewall dielectric spacers 330a and the planarized capping silicon-dioxide layer 332a in each of the plurality of self-aligned trench regions are selectively etched back to a depth equal to a thickness of the first conductive layer 302c by using anisotropic dry etching and the first conductive layers 302c in each of the plurality of self-aligned common-drain regions are then selectively removed by using anisotropic dry etching; and different ion-implantations are then performed to form a common-drain diffusion region 325a/325b, a deep implant region 326a, and a deeper implant region 326b in each active region as described in FIG. 4B.

Figure 5E:
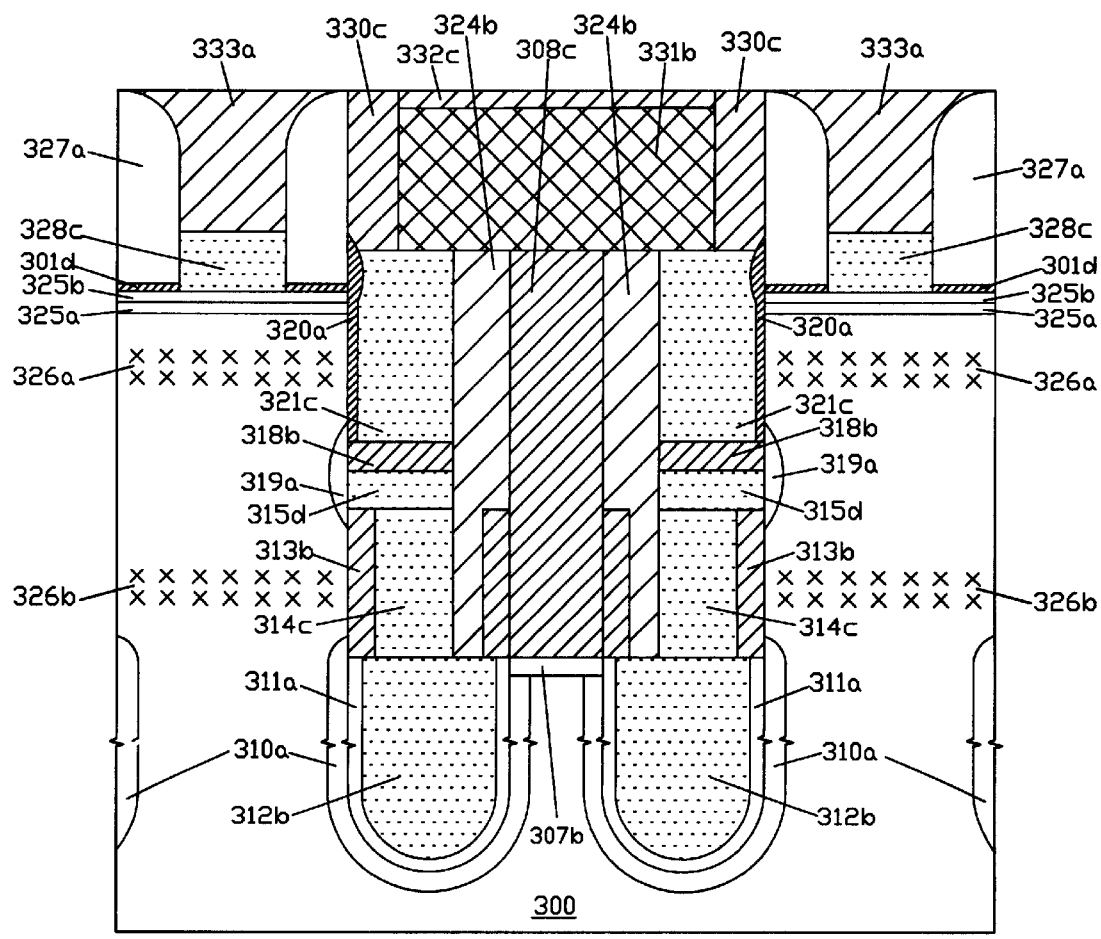

FIG. 5E shows that a pair of third sidewall dielectric spacers 327a are formed over each outer sidewall of nearby fourth sidewall dielectric spacers 330c, and the first dielectric layers 301c are then removed by dipping in dilute hydrofluoric acid or anisotropic dry etching; and subsequently, a common-drain conductive bus line 328c is formed over a flat bed between the pair of third sidewall dielectric spacers 327a and a second planarized thick-oxide layer 333a is formed over the common-drain conductive bus line 328c in each of the plurality of self-aligned common-drain regions. The third sidewall dielectric spacer 327a is preferably made of silicon-dioxide, silicon-nitride, or silicon-oxynitride as deposited by LPCVD. The flat bed is alternately formed by the common-drain diffusion region 325a/325b and the first-type fifth raised field-oxide layer 304f. The common-drain conductive bus line 328c is preferably made of doped polycrystalline-silicon and is implanted with a high dose of doping impurities of the second conductivity type, and can be a heavily-doped polycrystalline-silicon layer silicided with a refractory metal-silicide layer or capped with a tungsten-disilicide or tungsten layer for forming a highly conductive common-drain bit-line in each of the plurality of self-aligned common-drain regions.

Figure 5F:
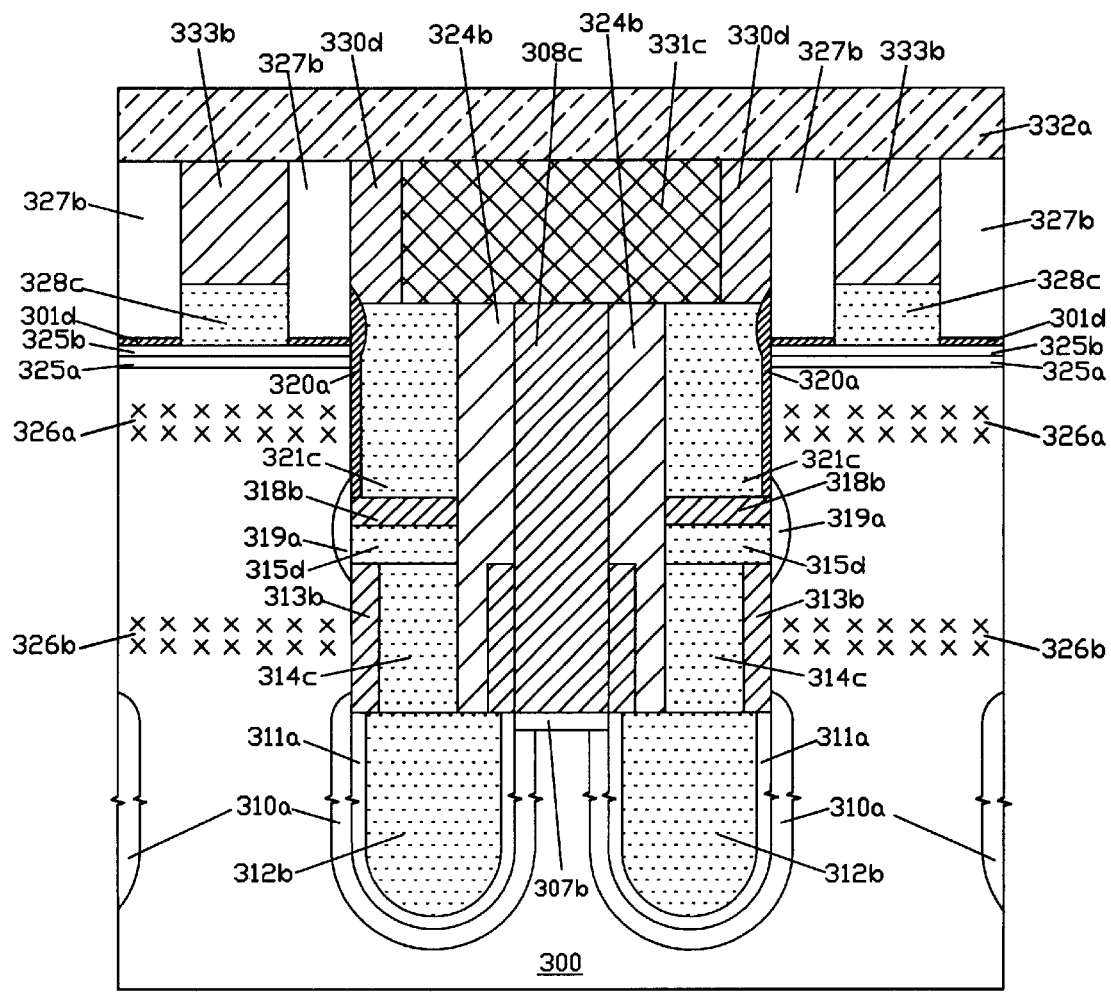

FIG. 5F shows that the pair of third sidewall dielectric spacers 327a and the second planarized thick-oxide layer 333a in each of the plurality of self-aligned common-drain regions and the pair of fourth sidewall dielectric spacers 330c and the planarized capping silicon-dioxide layer 332c in each of the plurality of self-aligned trench regions are etched back to a depth equal to a thickness of the planarized capping silicon-dioxide layer 332c; and subsequently, a metal layer 332 is formed over the etched-back flat surface and the metal layer 332 together with the planarized common-gate conductive layers 331b are simultaneously patterned and etched to form a plurality of metal word-line 332a integrated with planarized common-gate conductive islands 331c by using a photo-masking step. The metal layer 332 may comprise an aluminum or copper layer being formed over a barrier-metal layer. The photo-masking step may comprise a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

Figure 5G:
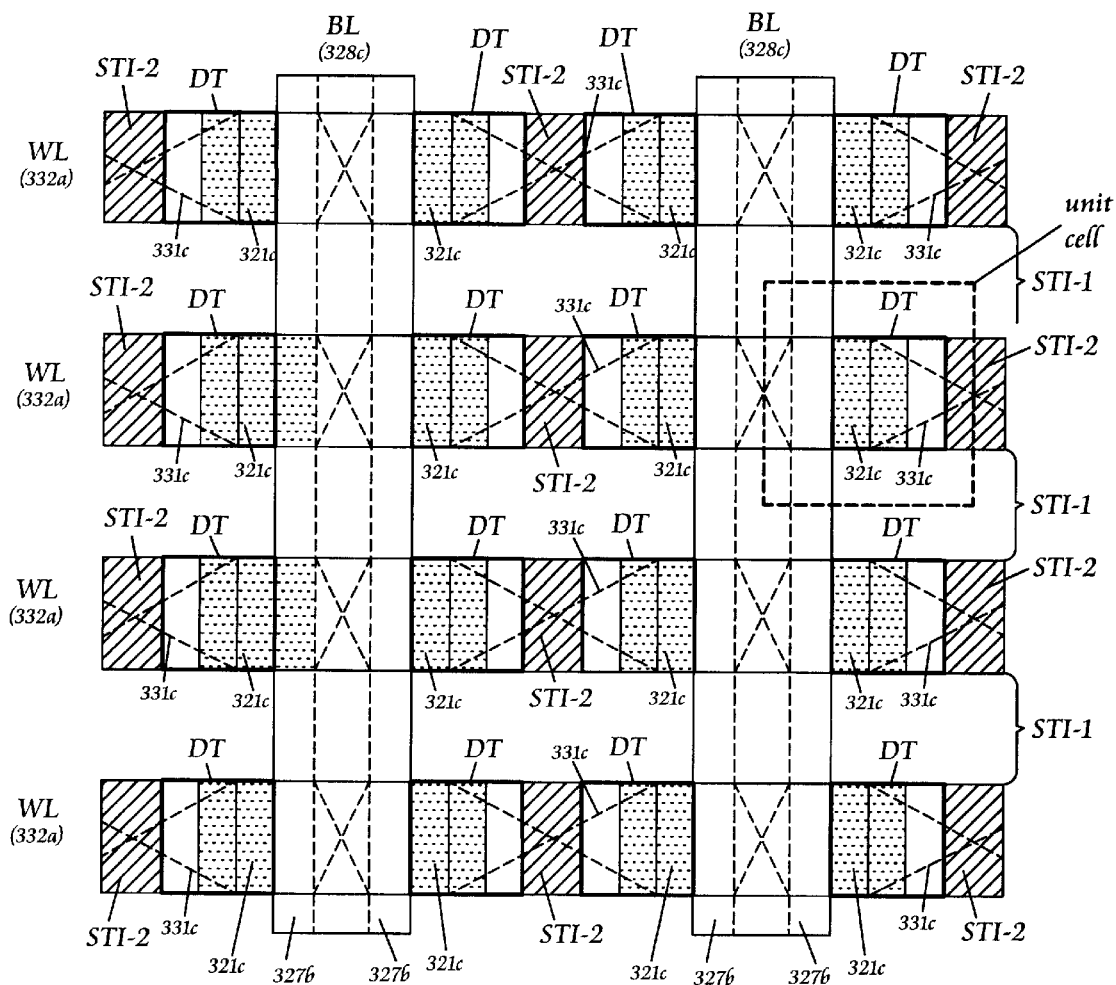
FIG. 5G shows a top plan view of a second-type contactless DRAM array of the present invention.

FIG. 5G shows a top plan view of the second-type contactless vertical transistor DRAM array of the present invention, in which a plurality of metal word-lines (WL) 332a integrated with planarized common-gate conductive islands 331c are formed transversely to a plurality of common-drain conductive bit-lines (BL) 328c; a plurality of first-type STI regions (STI-1) are formed alternately and are located transversely to the plurality of common-drain conductive bit-lines (BL) 328c; a second-type STI region (STI-2) is formed between a pair of deep trenches (DT); and each of the planarized common-gate conductive island is connected with a portion of the conductive-gate nodes 321c in nearby deep trenches. The unit cell size of a second-type contactless vertical transistor DRAM cell of the present invention as marked by a dash square is also scalable and can be made to be equal to or smaller than $4F^2$.

Accordingly, the advantages and the features of a self-aligned vertical transistor DRAM structure and its contactless DRAM arrays of the present invention can be summarized below:

(a) The self-aligned vertical transistor DRAM structure of the present invention can offer a scalable cell size equal to or smaller than $4F^2$.

(b) The self-aligned vertical transistor DRAM structure of the present invention can be fabricated with less masking photoresist steps as compared to the prior art.

(c) The self-aligned vertical transistor DRAM structure of the present invention can offer different implanted regions in a self-aligned manner for efficiently forming punch-through stops and adjusting threshold voltages of both vertical transistor and parasitic collar-oxide transistor so the depth of deep trenches can be made to be shallower as compared to the prior art.

(d) The first-type contactless vertical transistor DRAM array of the present invention can offer a plurality of metal bit-lines integrated with planarized common-drain conductive islands and a plurality of conductive word-lines for high-speed read and write operations.

(e) The second-type contactless vertical transistor DRAM array of the present invention can offer a plurality of metal word-lines integrated with planarized common-gate conductive islands and a plurality of conductive bit-lines for high-speed read and write operations.

While the present invention has been particularly shown and described with references to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A self-aligned vertical transistor DRAM structure, comprising:
   a semiconductor substrate of a first conductivity type having an active region and two parallel first-type shallow-trench-isolation (STI) regions, wherein said active region is located between said two parallel first-type STI regions;
   a DRAM cell comprising a self-aligned trench region and a self-aligned common-drain region being formed on said semiconductor substrate, wherein said self-aligned trench region comprises a deep-trench region and a second-type STI region outside of said deep-trench region being located in said active region and two first-type second or third raised field-oxide layers being formed in said two parallel first-type STI regions;

a second-type second or third raised field-oxide layer being formed in said second-type STI region;

said deep-trench region being defined by a first sidewall dielectric spacer comprising: a trench capacitor being formed in a lower portion of a deep trench, a collar-oxide layer together with a capacitor-node connector being formed in a central portion of said deep trench, and a vertical transistor region being formed in an upper portion of said deep trench;

said trench capacitor comprising an upper capacitor node being formed over a capacitor-dielectric layer and said capacitor-dielectric layer being formed over a lower capacitor node in said semiconductor substrate;

said vertical transistor region comprising a gate-dielectric layer over a sidewall of said deep trench together with a conductive-gate node being formed over an isolation silicon-dioxide node, said isolation silicon-dioxide node being formed over a source conductive node, and said source conductive node being formed over said capacitor-node connector and a portion of said collar-oxide layer to act as a dopant diffusion source for forming a common-source diffusion region near its sidewall portion of said semiconductor substrate; and said self-aligned common-drain region being located in an outside portion of said self-aligned trench region comprising a common-drain diffusion region of said second conductivity type being formed in said semiconductor substrate of said active region, a third sidewall dielectric spacer being formed over an outer sidewall of said self-aligned trench region, and a flat bed being located outside of said third sidewall dielectric spacer and formed by a common-drain diffusion region of said second conductivity type in said active region and two first-type fifth raised field-oxide layers in said two parallel first-type STI regions, wherein each of the plurality of active regions under said common-drain diffusion region comprises a deep implant region of said first conductivity type being formed in said semiconductor substrate near a central portion of said gate-dielectric layer in said vertical transistor region, said common-source diffusion region of said second conductivity type being formed in said semiconductor substrate near an outside portion of said source conductive node, and a deeper implant region of said first conductivity type being formed in said semiconductor substrate near a central portion of said collar-oxide layer.

2. The self-aligned vertical transistor DRAM structure according to claim 1, wherein a planarized common-drain conductive island is formed over said common-drain diffusion region outside of said third sidewall dielectric spacer and a metal bit-line integrated with said planarized common-drain conductive island are simultaneously patterned by a photo-masking step being aligned above said active region for forming a first-type self-aligned vertical transistor DRAM cell.

3. The self-aligned vertical transistor DRAM structure according to claim 1, wherein a common-drain conductive bus line being acted as a bit line is formed over said flat bed outside of said third sidewall dielectric spacer and a second planarized thick-oxide layer is formed over said common-drain conductive bus line for forming a second-type self-aligned vertical transistor DRAM cell.

4. The self-aligned vertical transistor DRAM structure according to claim 1, wherein an elongated conductive-gate layer being defined by a second sidewall dielectric spacer and being acted as a word line is formed over said conductive-gate node in said deep trench and two first-type second raised field-oxide layers in said two parallel first-type STI regions for forming a first-type self-aligned vertical transistor DRAM cell.

5. The self-aligned vertical transistor DRAM structure according to claim 1, wherein a planarized common-gate conductive island being formed outside of a fourth sidewall dielectric spacer is formed over a portion of said conductive-gate node in said deep trench and a metal word-line integrated with said planarized common-gate conductive island are simultaneously patterned by a photo-masking step being aligned above said active region for forming a second-type self-aligned vertical transistor DRAM cell.

6. The self-aligned vertical transistor DRAM structure according to claim 1, wherein said conductive-gate node, said isolation silicon-dioxide node, said source conductive node, and said capacitor-node connector are simultaneously patterned by a second sidewall dielectric spacer being formed over an outer sidewall of said self-aligned common-drain region or are simultaneously patterned by a photo-masking step.

7. The self-aligned vertical transistor DRAM structure according to claim 1, wherein a bottom surface level of said second-type second or third raised field-oxide layer is approximately equal to that of said collar-oxide layer and a heavily-implanted region of said second conductivity type is formed under said second-type second or third raised field-oxide layer and is connected with said lower capacitor node being formed by a heavily-doped diffusion region of said second conductivity type.

8. A contactless self-aligned vertical transistor DRAM array, comprising:

a semiconductor substrate of a first conductivity type having a plurality of active regions and a plurality of parallel first-type shallow-trench-isolation (STI) regions formed alternately;

a plurality of self-aligned trench regions and a plurality of self-aligned common-drain regions being alternately formed on said semiconductor substrate and transversely to the plurality of active regions, wherein each of the plurality of self-aligned trench regions comprises a plurality of paired deep-trench regions and a plurality of second-type STI regions being formed between the plurality of paired deep-trench regions in the plurality of active regions and a plurality of first-type second or third raised field-oxide layers being formed in the plurality of parallel first-type STI regions;

a plurality of second-type second or third raised field-oxide layers being formed in the plurality of second-type STI regions;

the plurality of paired deep-trench regions being defined by a pair of first sidewall dielectric spacers formed over each outer sidewall of nearby self-aligned common-drain regions in each of the plurality of self-aligned trench regions, wherein said deep-trench region comprises: a trench capacitor being formed in a lower portion of a deep trench, a collar-oxide layer together with a capacitor-node connector being formed in a central portion of said deep trench, and a vertical transistor region being formed in an upper portion of said deep trench;

said trench capacitor comprising an upper capacitor node being formed over a capacitor-dielectric layer and said capacitor-dielectric layer being formed over a lower capacitor node in said semiconductor substrate;

said vertical transistor region comprising a gate-dielectric layer over a sidewall of said deep trench together with a conductive-gate node being formed over an isolation silicon-dioxide node, said isolation silicon-dioxide node being formed over a source conductive node, and said source conductive node being formed over said capacitor-node connector and a portion of said collar-oxide layer to act as a dopant diffusion source for forming a common-source diffusion region near its sidewall portion of said semiconductor substrate; and said self-aligned common-drain region comprising: a common-drain diffusion region of said second conductivity type being formed in said semiconductor substrate of each of the plurality of active regions, a pair of third sidewall dielectric spacers being formed over each outer sidewall of nearby self-aligned trench regions, and a flat bed being located between said pair of third sidewall dielectric spacers and formed alternately by said common-drain diffusion region of said second conductivity type in said active region and a first-type fifth raised field-oxide layer in said parallel first-type STI region, wherein said active region under said common-drain diffusion region comprises a deep implant region of said first conductivity type being formed in said semiconductor substrate near a central portion of said gate-dielectric layer in said vertical transistor region, said common-source diffusion region of said second conductivity type being formed in said semiconductor substrate near an outer portion of said source conductive node of said second conductivity type, and a deeper implant region of said first conductivity type being formed in said semiconductor substrate near a central portion of said collar-oxide layer.

9. The contactless self-aligned DRAM array according to claim 8, wherein a plurality of planarized common-drain conductive islands are formed over said common-drain diffusion regions between said pair of third sidewall dielectric spacers and a plurality of metal bit-lines integrated with said planarized common-drain conductive islands are simultaneously patterned by a photo-masking step being aligned above the plurality of active regions for forming a first-type contactless self-aligned vertical transistor DRAM array.

10. The contactless self-aligned DRAM array according to claim 8, wherein a common-drain conductive bus line being acted as a bit-line is formed over said flat bed between said pair of third sidewall dielectric spacers and a second planarized thick-oxide layer is formed over said common-drain conductive bus line for forming a second-type contactless self-aligned vertical transistor DRAM array.

11. The contactless self-aligned DRAM array according to claim 8, wherein an elongated conductive-gate layer being defined by a second sidewall dielectric spacer or a masking photoresist step to act as a word line is formed over a flat surface alternately formed by said conductive-gate node in said deep trench and a first-type second raised field-oxide layer in said parallel first-type STI region for forming a first-type contactless self-aligned vertical transistor DRAM array.

12. The contactless self-aligned DRAM array according to claim 8, wherein planarized common-gate conductive islands being formed between a pair of fourth sidewall dielectric spacers and on a portion of said conductive-gate nodes in the plurality of paired deep-trench regions and a plurality of metal word-lines integrated with said planarized common-gate conductive islands are simultaneously patterned by a photo-masking step being aligned above the plurality of active regions for forming a second-type contactless self-aligned vertical transistor DRAM array.

13. The contactless self-aligned DRAM array according to claim 8, wherein said conductive-gate nodes, said isolation silicon-dioxide nodes, said source conductive nodes, and said capacitor-node connectors in each of the plurality of self-aligned trench regions are simultaneously patterned by a pair of second sidewall dielectric spacers being formed over each inner sidewall of nearby self-aligned common-drain regions or are simultaneously patterned by a photo-masking step.

14. The contactless self-aligned DRAM array according to claim 8, wherein a bottom surface level of said second-type second or third raised field-oxide layer is approximately equal to that of said collar-oxide layer and a heavily-implanted region of said second conductivity type is formed under said second-type second or third raised field-oxide layer and is connected with said lower capacitor node being formed by a heavily-doped diffusion region of said second conductivity type.

* * * * *